US012386221B2

(12) United States Patent
Nakamura

(10) Patent No.: US 12,386,221 B2
(45) Date of Patent: Aug. 12, 2025

(54) LIGHT-EMITTING DEVICE, DISPLAY APPARATUS, AND ILLUMINATION APPARATUS

(71) Applicant: SATURN LICENSING LLC, New York, NY (US)

(72) Inventor: Tomoharu Nakamura, Tokyo (JP)

(73) Assignee: SATURN LICENSING LLC, New York, NY (US)

( * ) Notice: Subject to any disclaimer, the term of this patent is extended or adjusted under 35 U.S.C. 154(b) by 0 days.

(21) Appl. No.: 18/113,664

(22) Filed: Feb. 24, 2023

(65) Prior Publication Data
US 2023/0280615 A1 Sep. 7, 2023

Related U.S. Application Data

(63) Continuation of application No. 17/678,540, filed on Feb. 23, 2022, now Pat. No. 11,630,344, which is a (Continued)

(30) Foreign Application Priority Data

Mar. 24, 2016 (JP) .................................. 2016060359

(51) Int. Cl.
*H01L 33/50* (2010.01)
*F21S 2/00* (2016.01)
(Continued)

(52) U.S. Cl.
CPC .......... *G02F 1/133603* (2013.01); *F21S 2/00* (2013.01); *F21V 29/503* (2015.01);
(Continued)

(58) Field of Classification Search
CPC ... H01L 33/502; H01L 33/486; H01L 33/644; H01L 33/00; H01L 25/0753;
(Continued)

(56) References Cited

U.S. PATENT DOCUMENTS

2004/0211970 A1* 10/2004 Hayashimoto ..... H10H 20/8506
257/E33.061
2004/0257797 A1* 12/2004 Suehiro .............. H10H 20/8515
362/34
(Continued)

FOREIGN PATENT DOCUMENTS

CN 1540773 A 10/2004
CN 103443941 A 12/2013
(Continued)

OTHER PUBLICATIONS

International Search Report and Written Opinion of PCT Application No. PCT/JP2017/002717, dated Mar. 21, 2017, 15 pages of ISRWO—*—cited in parent application.

*Primary Examiner* — Sheikh Maruf
(74) *Attorney, Agent, or Firm* — SATURN LICENSING LLC

(57) ABSTRACT

Provided is a light-emitting device that makes it possible to emit, with high efficiency, light having higher uniformity. The light-emitting device includes a light source, a wavelength conversion unit, and a wall member. The light source is disposed on a substrate. The wavelength conversion unit includes a wavelength conversion member and a transparent member that contains the wavelength conversion member therein. The wavelength conversion member is disposed to face the light source in a thickness direction and converts first wavelength light from the light source to second wavelength light. The wall member is provided on a substrate and surrounds the light source in a plane that is orthogonal to the thickness direction. A region occupied by the wavelength conversion member is wider than a region surrounded by the wall member, and entirely overlaps with the region surrounded by the wall member in the thickness direction.

20 Claims, 20 Drawing Sheets

Related U.S. Application Data continuation of application No. 16/952,643, filed on Nov. 19, 2020, now Pat. No. 11,294,228, which is a continuation of application No. 16/084,642, filed as application No. PCT/JP2017/002717 on Jan. 26, 2017, now Pat. No. 10,877,346.

(51) Int. Cl.

| | | |
|---|---|---|
| *F21V 29/503* | (2015.01) | |
| *G02B 5/08* | (2006.01) | |
| *G02F 1/13357* | (2006.01) | |
| *G02F 1/15* | (2019.01) | |
| *H10H 20/80* | (2025.01) | |
| *H10H 20/84* | (2025.01) | |
| *H10H 20/851* | (2025.01) | |
| *H10H 20/855* | (2025.01) | |
| *H10H 20/856* | (2025.01) | |
| *H10H 20/858* | (2025.01) | |
| *G02F 1/1335* | (2006.01) | |
| *H10H 20/85* | (2025.01) | |

(52) U.S. Cl.
CPC .............. *G02B 5/08* (2013.01); *G02F 1/15* (2013.01); *H10H 20/80* (2025.01); *H10H 20/851* (2025.01); *H10H 20/8512* (2025.01); *H10H 20/8514* (2025.01); *H10H 20/8515* (2025.01); *H10H 20/855* (2025.01); *H10H 20/856* (2025.01); *H10H 20/858* (2025.01); *G02F 1/133614* (2021.01); *H10H 20/84* (2025.01); *H10H 20/8506* (2025.01); *H10H 20/8583* (2025.01)

(58) Field of Classification Search
CPC .. G02F 1/33603; G02F 1/15; G02F 1/133614; G02F 1/133605; G02F 1/133606; G02F 1/133608; F21S 2/00; F21V 29/503; F21V 5/002; F21V 9/30; F21V 7/22; G02B 5/08; H10H 20/80; H10H 20/851; H10H 20/8512; H10H 20/8514; H10H 20/8515; H10H 20/855; H10H 20/856; H10H 20/858; H10H 20/84; H10H 20/8506; H10H 20/8583; H10H 20/8581
USPC ............................................................ 257/98
See application file for complete search history.

(56) References Cited

U.S. PATENT DOCUMENTS

| | | | | |
|---|---|---|---|---|
| 2006/0214175 | A1* | 9/2006 | Tian | C09K 11/7731 313/503 |
| 2007/0249864 | A1* | 10/2007 | Niimoto | C07C 231/02 564/161 |
| 2008/0123698 | A1* | 5/2008 | Takata | C09K 11/7774 252/301.36 |
| 2008/0225523 | A1 | 9/2008 | De et al. | |
| 2009/0147497 | A1 | 6/2009 | Nada | |
| 2009/0322197 | A1* | 12/2009 | Helbing | H10H 20/8583 313/46 |
| 2009/0322208 | A1* | 12/2009 | Shaikevitch | H01L 33/507 313/503 |
| 2010/0163914 | A1 | 7/2010 | Urano | |
| 2011/0164203 | A1 | 7/2011 | Kimura | |
| 2011/0315956 | A1 | 12/2011 | Tischler et al. | |
| 2012/0018764 | A1 | 1/2012 | Choi et al. | |
| 2012/0146077 | A1* | 6/2012 | Nakatsu | H10H 20/8506 257/E33.061 |
| 2012/0153316 | A1* | 6/2012 | Helbing | H01L 33/507 257/E27.12 |
| 2013/0070481 | A1 | 3/2013 | Ito | |
| 2013/0146903 | A1* | 6/2013 | Ichikawa | H10K 59/122 438/34 |
| 2014/0021503 | A1* | 1/2014 | Yoshida | H10H 20/8581 977/774 |
| 2014/0098529 | A1 | 4/2014 | Hata et al. | |
| 2014/0225139 | A1* | 8/2014 | Park | H10H 20/8506 438/27 |
| 2014/0367633 | A1 | 12/2014 | Bibl et al. | |
| 2015/0036317 | A1 | 2/2015 | Yamamoto et al. | |
| 2015/0077970 | A1 | 3/2015 | Cha et al. | |
| 2015/0198304 | A1* | 7/2015 | Ohkawa | F21K 9/64 362/241 |
| 2016/0190418 | A1 | 6/2016 | Inomata et al. | |
| 2016/0369954 | A1 | 12/2016 | Anc et al. | |
| 2017/0122527 | A1 | 5/2017 | Miyanaga et al. | |
| 2018/0006167 | A1 | 1/2018 | Nomura et al. | |
| 2018/0136521 | A1 | 5/2018 | Nakaki et al. | |
| 2018/0323352 | A1 | 11/2018 | Takano et al. | |
| 2018/0356070 | A1 | 12/2018 | Miyanaga et al. | |
| 2018/0358523 | A1 | 12/2018 | Yu et al. | |
| 2019/0072245 | A1 | 3/2019 | Kobayashi et al. | |
| 2019/0207066 | A1 | 7/2019 | Göötz et al. | |
| 2019/0214376 | A1 | 7/2019 | Kim | |
| 2019/0369469 | A1 | 12/2019 | Ishige et al. | |
| 2020/0119233 | A1 | 4/2020 | Dupont | |
| 2020/0209462 | A1* | 7/2020 | Kasai | G02B 6/0021 |
| 2020/0285112 | A1* | 9/2020 | Miyata | G02F 1/133605 |
| 2020/0408382 | A1 | 12/2020 | Kleijnen et al. | |
| 2021/0104647 | A1 | 4/2021 | Harrold et al. | |
| 2021/0184088 | A1 | 6/2021 | Kwon et al. | |
| 2021/0305225 | A1 | 9/2021 | Kim | |
| 2022/0037395 | A1 | 2/2022 | Lee et al. | |
| 2022/0316661 | A1 | 10/2022 | Nishi et al. | |
| 2022/0336434 | A1 | 10/2022 | Zhang et al. | |

FOREIGN PATENT DOCUMENTS

| | | | |
|---|---|---|---|
| CN | 103548159 | A | 1/2014 |
| CN | 104932142 | | 9/2015 |
| EP | 1857790 | A2 | 11/2007 |
| EP | 2068193 | A2 | 6/2009 |
| EP | 2717338 | A1 | 4/2014 |
| EP | 2650721 | B1 | 9/2014 |
| EP | 2392852 | B1 | 7/2019 |
| JP | 2004327863 | A | 11/2004 |
| JP | 2006344717 | A | 12/2006 |
| JP | 2007109947 | A | 4/2007 |
| JP | 2007234637 | | 9/2007 |
| JP | 2008211250 | | 9/2008 |
| JP | 2009140822 | A | 6/2009 |
| JP | 2012155999 | A | 8/2012 |
| JP | 2013033833 | A | 2/2013 |
| JP | 2013531378 | | 8/2013 |
| JP | 2013211250 | | 10/2013 |
| JP | 2014199831 | A | 10/2014 |
| JP | 2015038978 | A | 2/2015 |
| JP | 2015061014 | A | 3/2015 |
| JP | 2015513213 | A | 4/2015 |
| JP | 2015122541 | A | 7/2015 |
| JP | 2015146437 | A | 8/2015 |
| JP | 2015216104 | | 12/2015 |
| JP | 2016507162 | | 3/2016 |
| KR | 20040092512 | A | 11/2004 |
| KR | 20120135736 | | 12/2012 |
| KR | 20130057676 | A | 6/2013 |
| TW | 595019 | B | 6/2004 |
| TW | 200423431 | A | 11/2004 |
| TW | 201547065 | A | 12/2015 |
| WO | 2008535233 | | 8/2008 |
| WO | 2008105428 | | 9/2008 |
| WO | 2010150516 | A1 | 12/2010 |
| WO | 2011109094 | A1 | 9/2011 |
| WO | 2012132232 | A1 | 10/2012 |
| WO | 2012165007 | A1 | 12/2012 |
| WO | 2013024684 | A1 | 2/2013 |
| WO | 2015156227 | A1 | 10/2015 |

* cited by examiner

[FIG. 1]
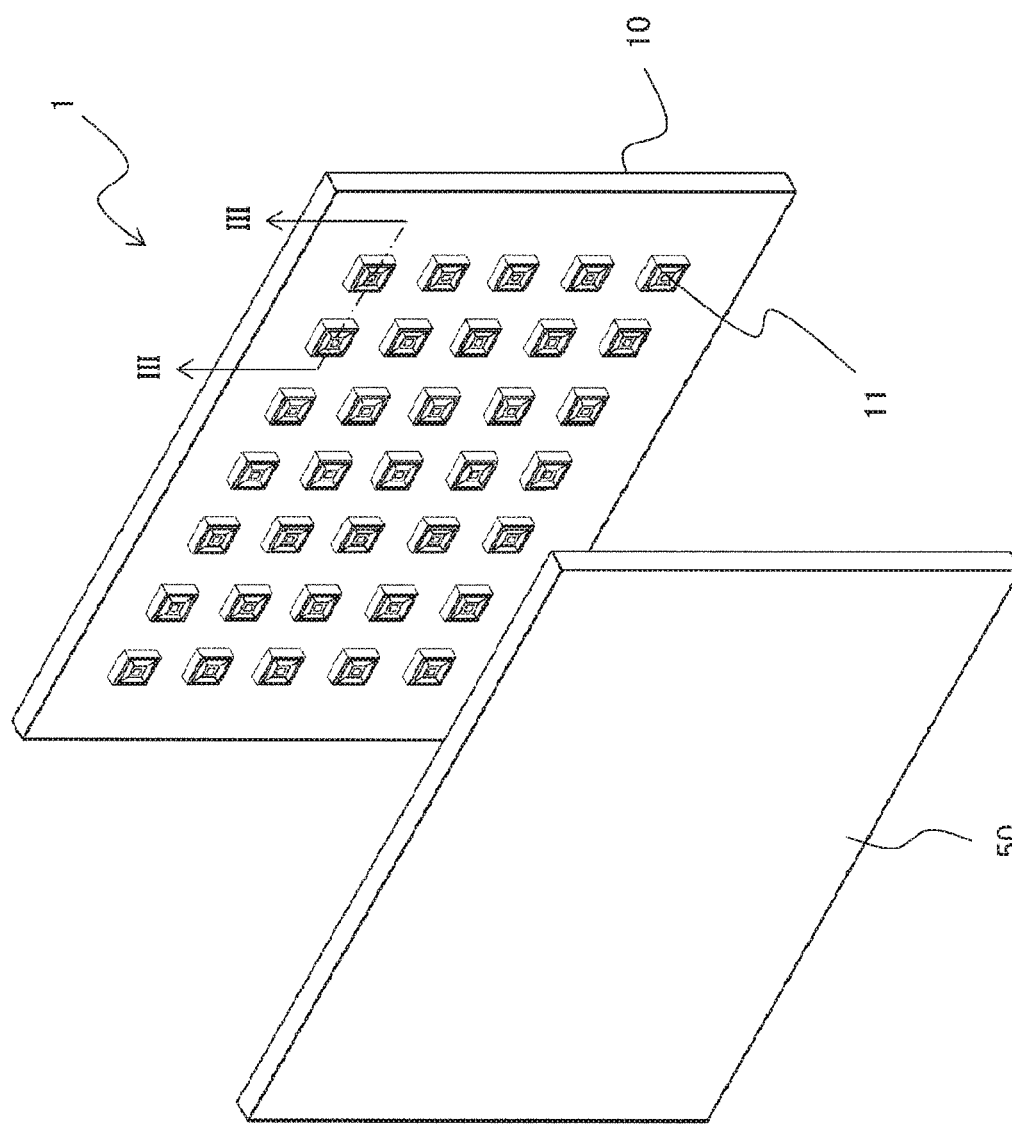

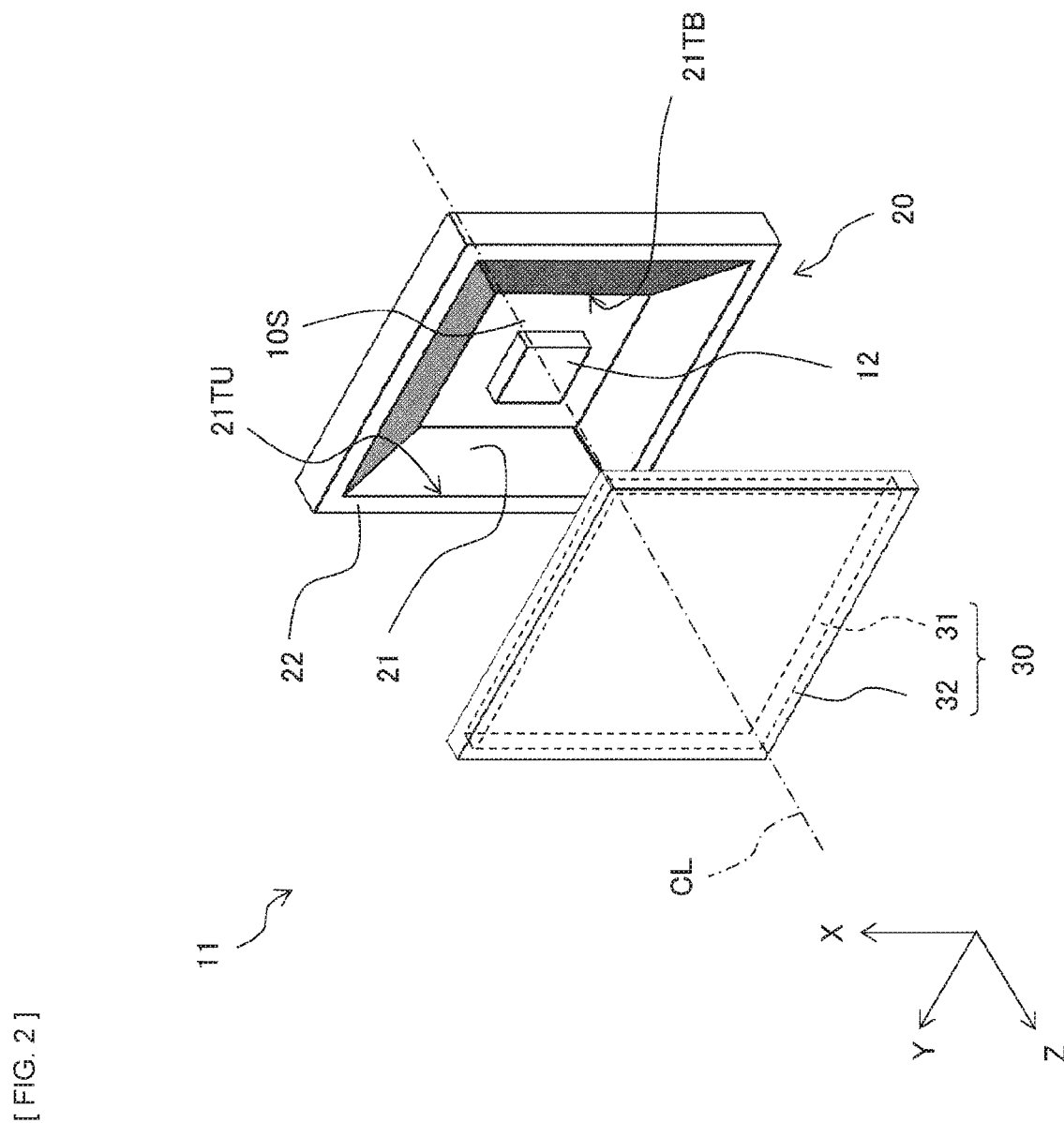
[FIG. 2]

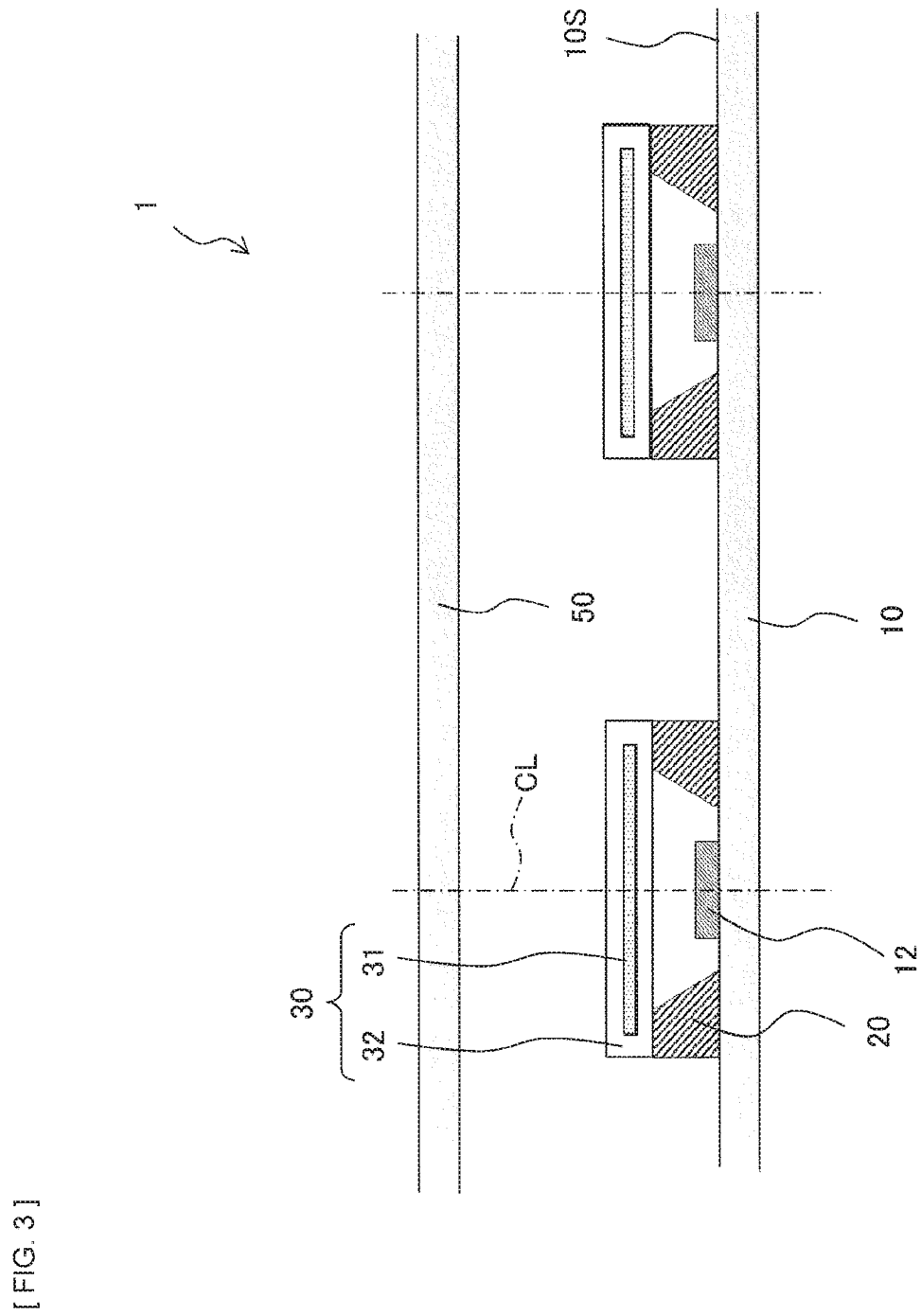

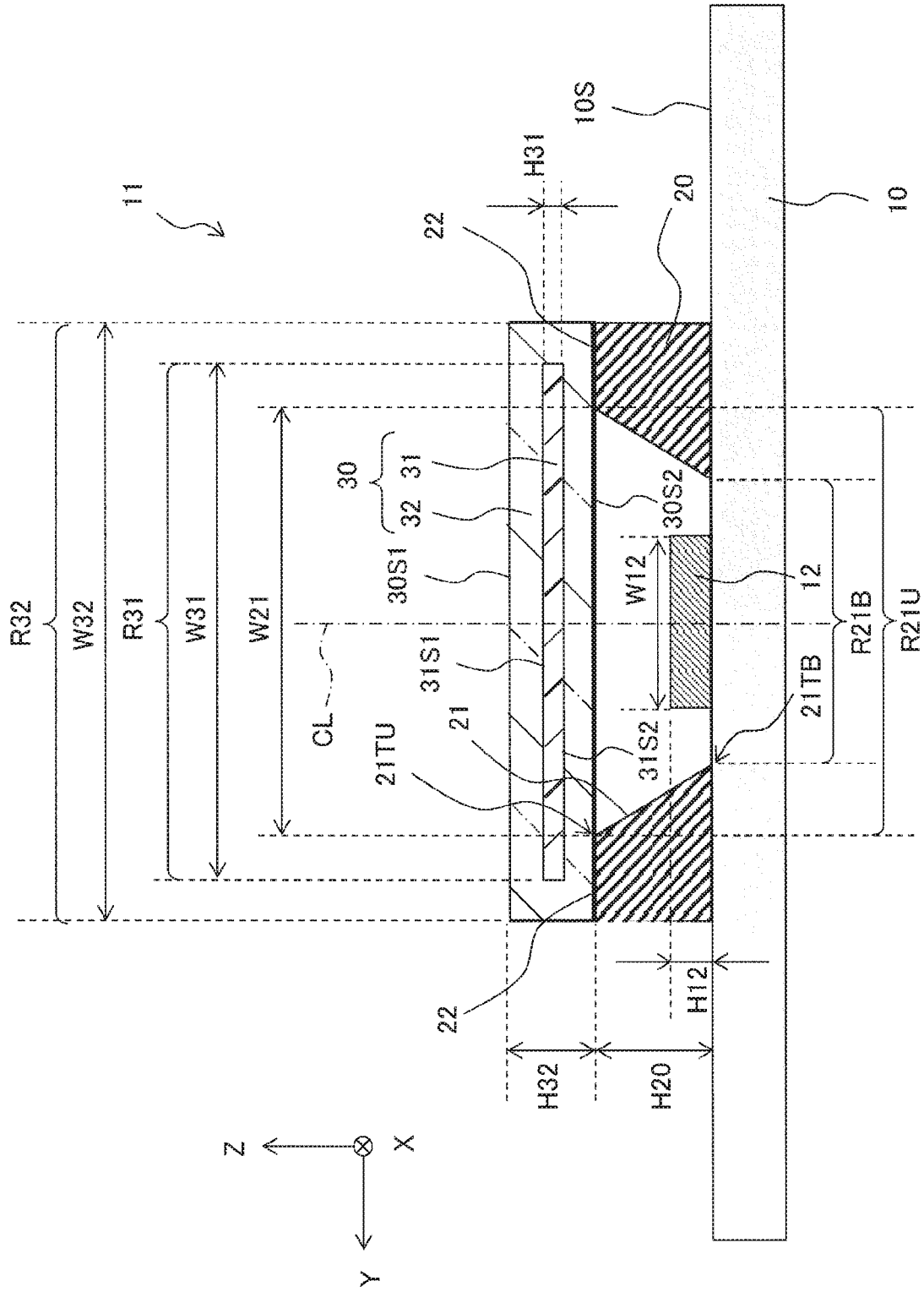
[FIG. 4]

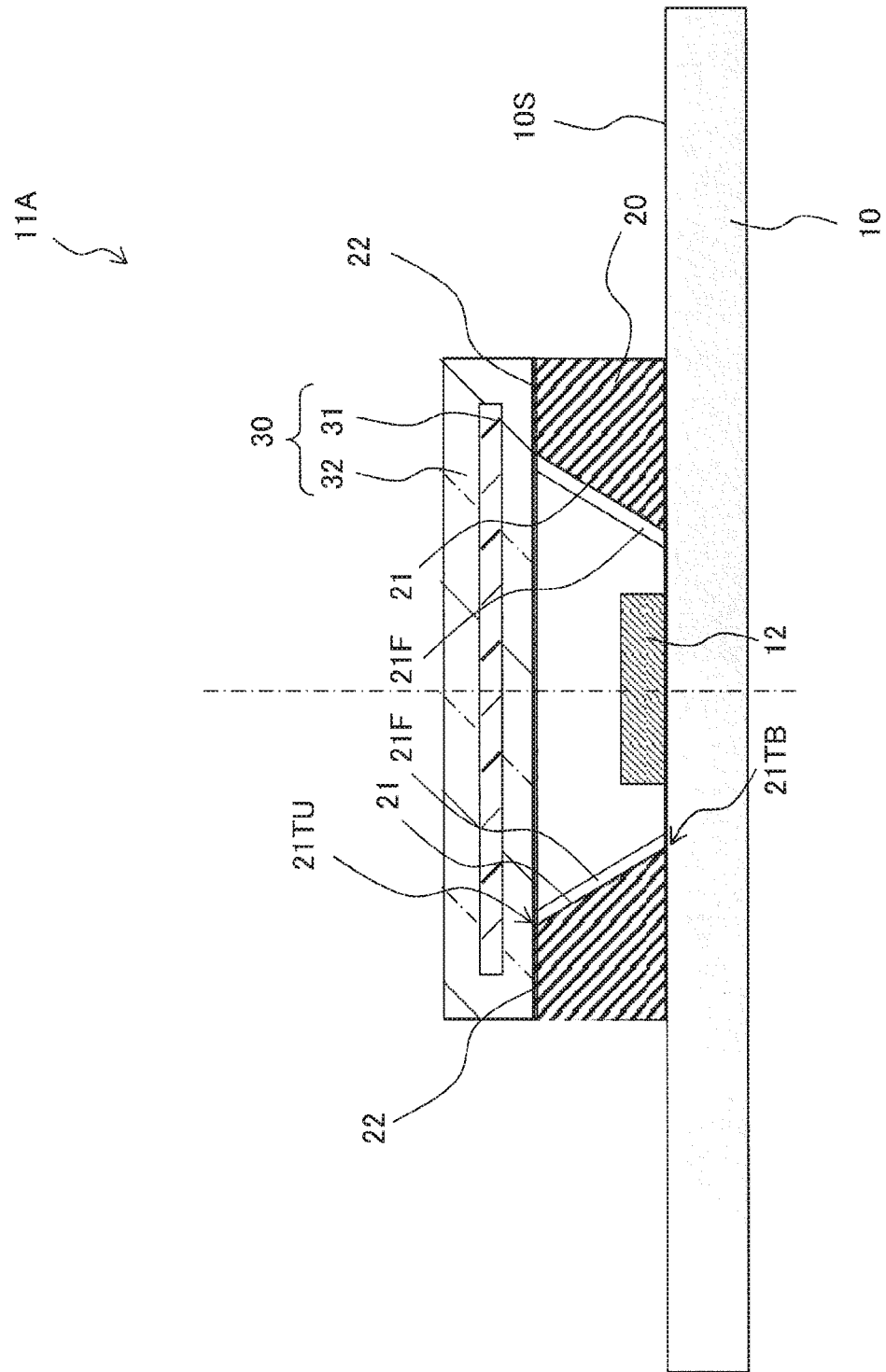

[FIG. 6]
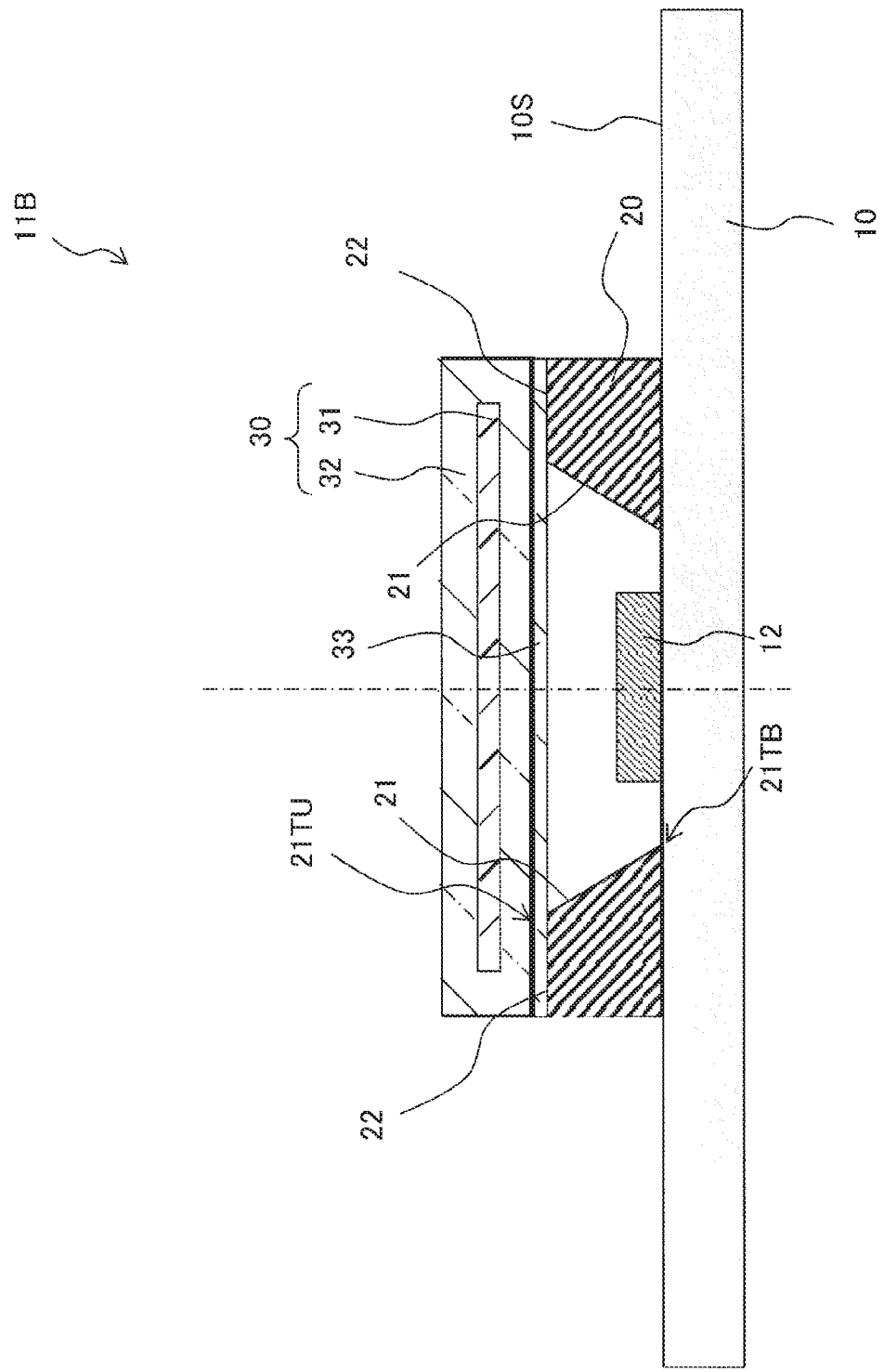

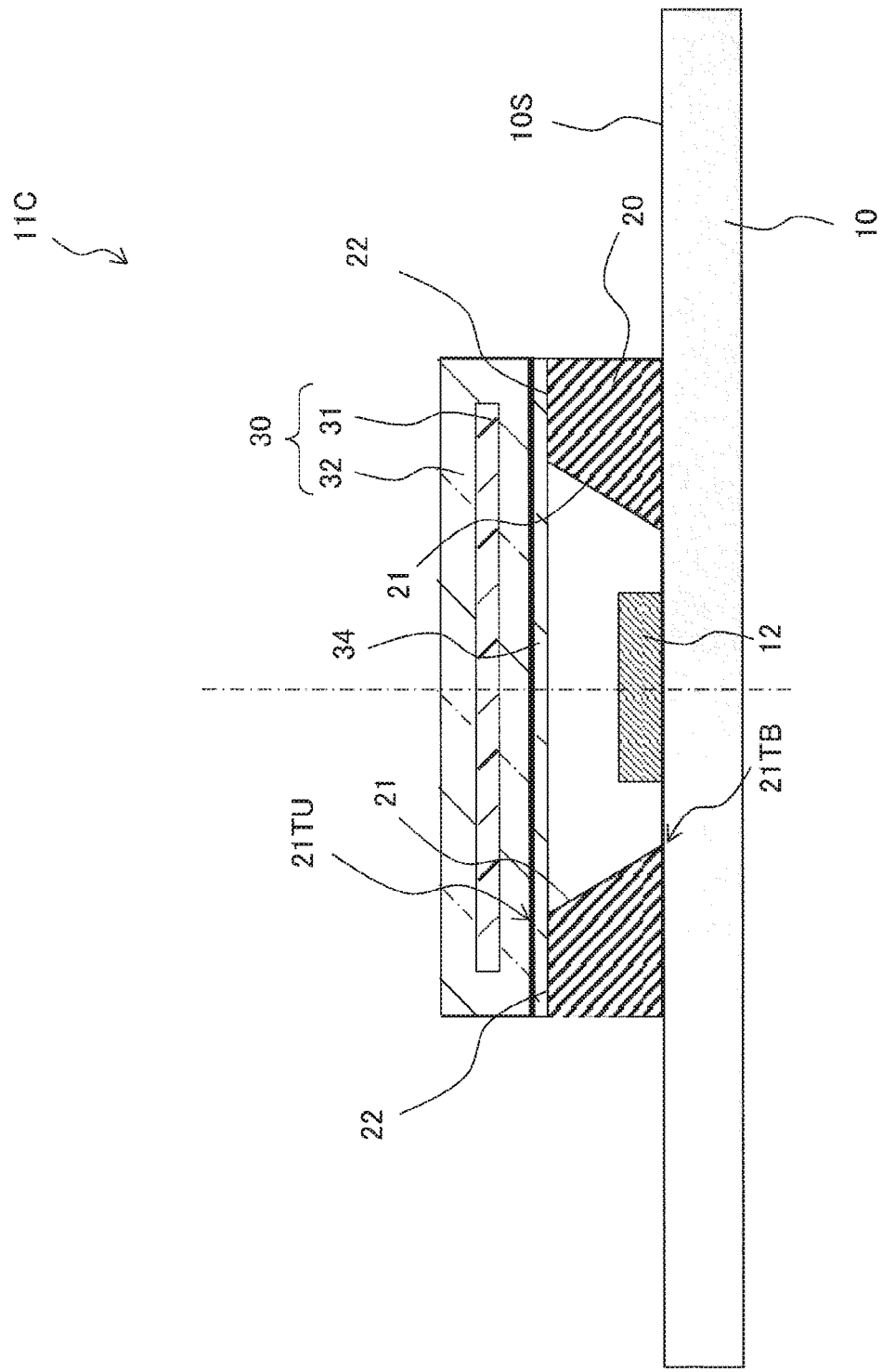

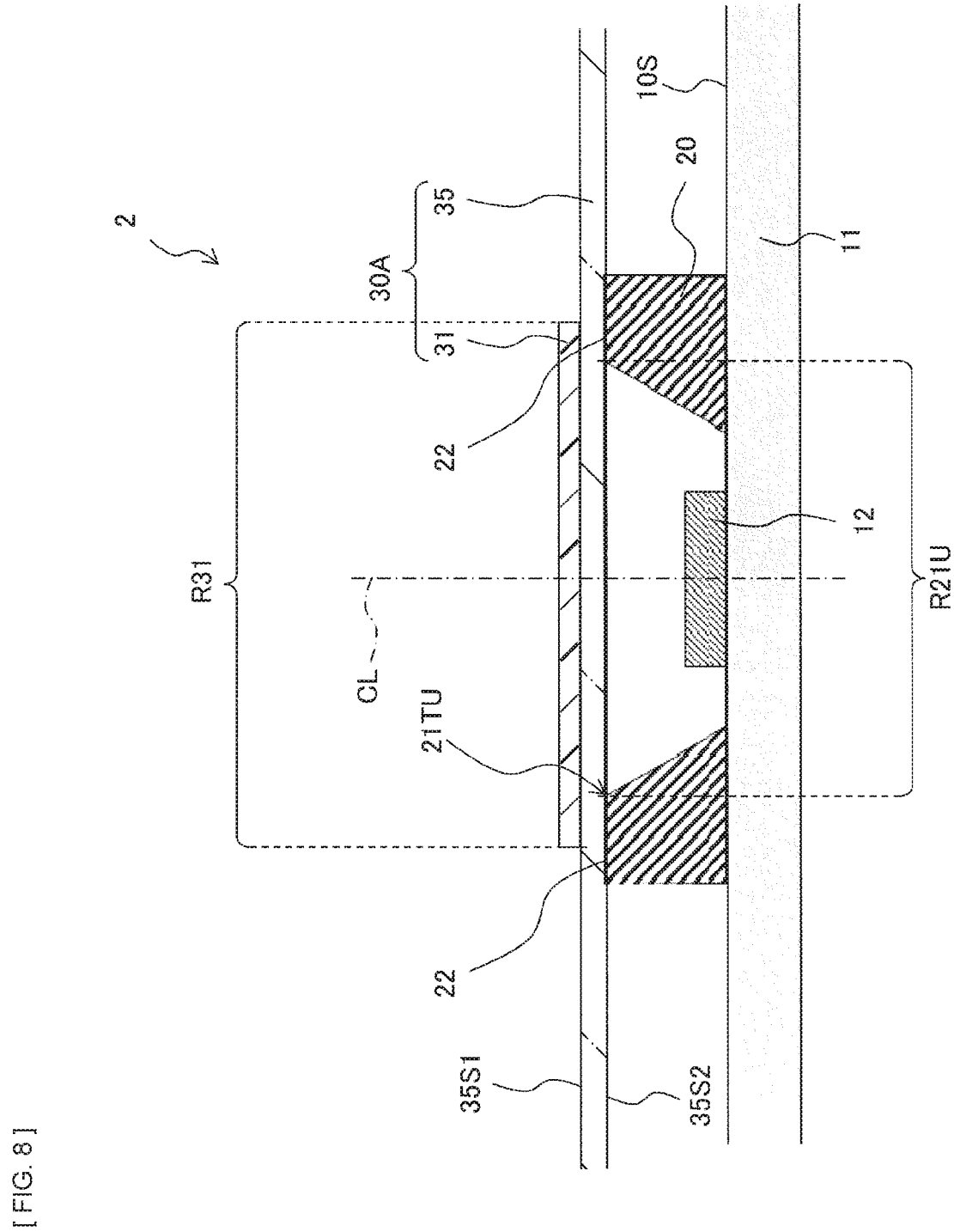
[FIG. 8]

[FIG. 9]
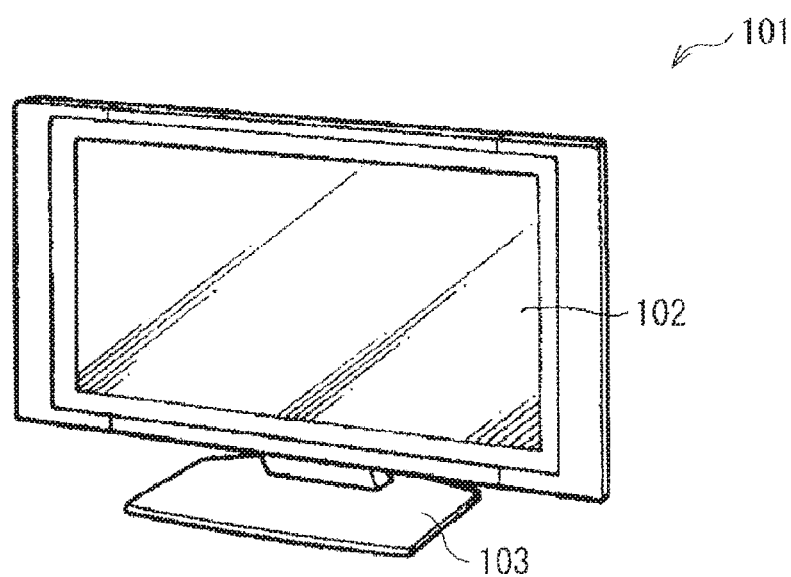

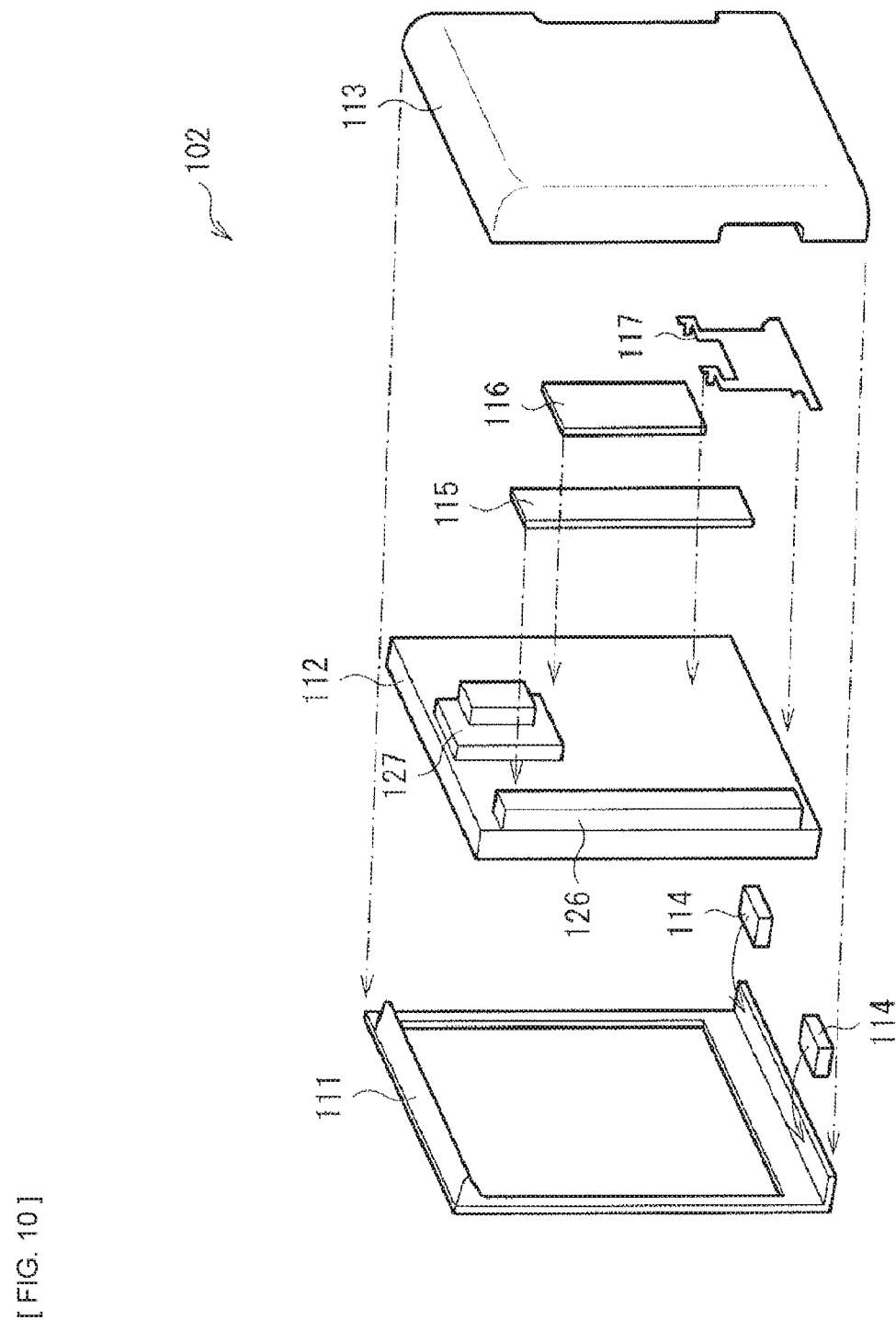
[FIG. 10]

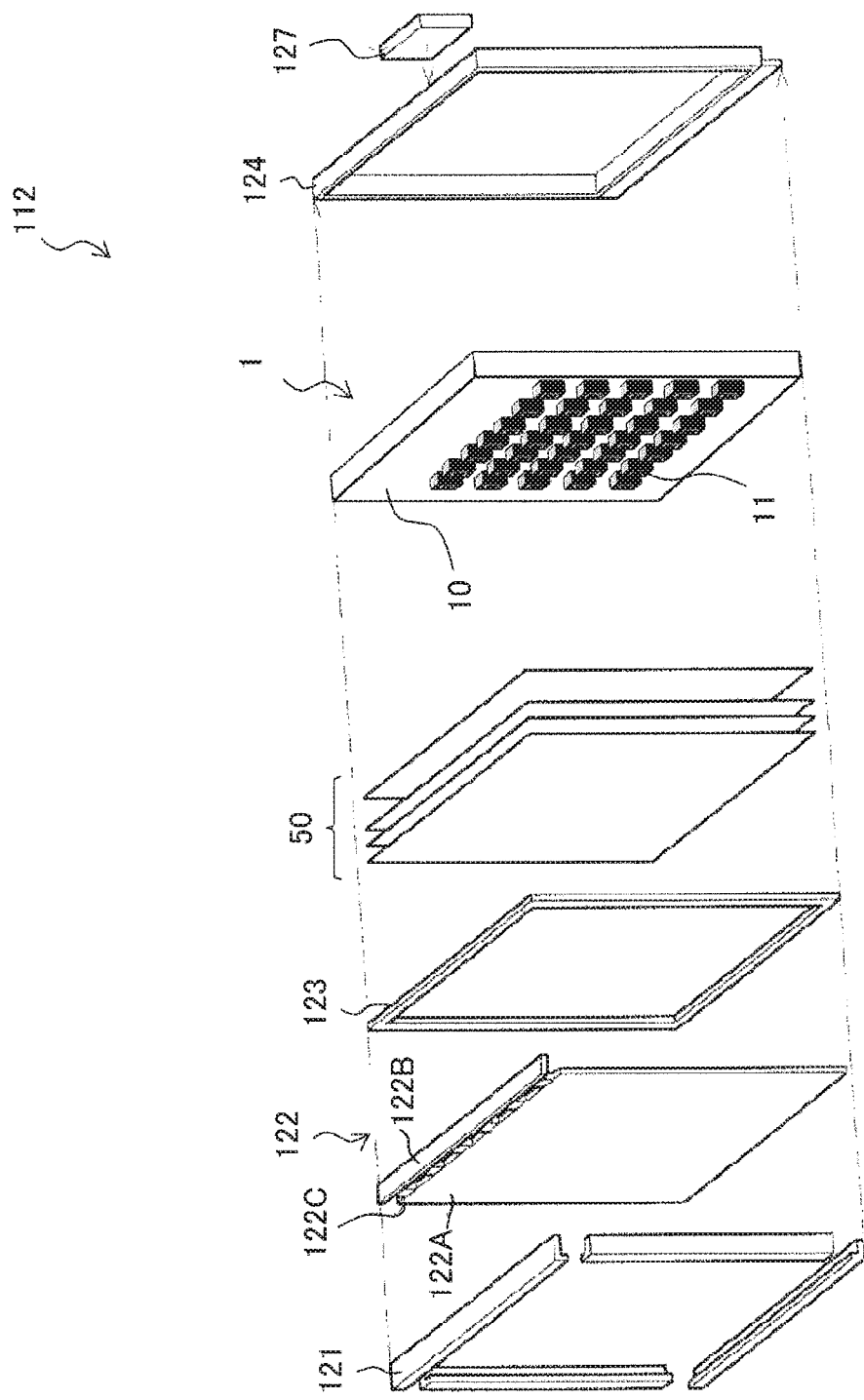
[FIG. 11]

[ FIG. 12A ]
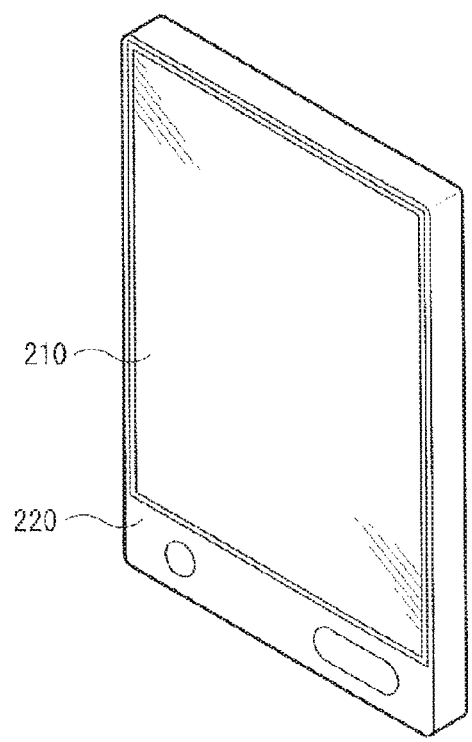
[ FIG. 12B ]
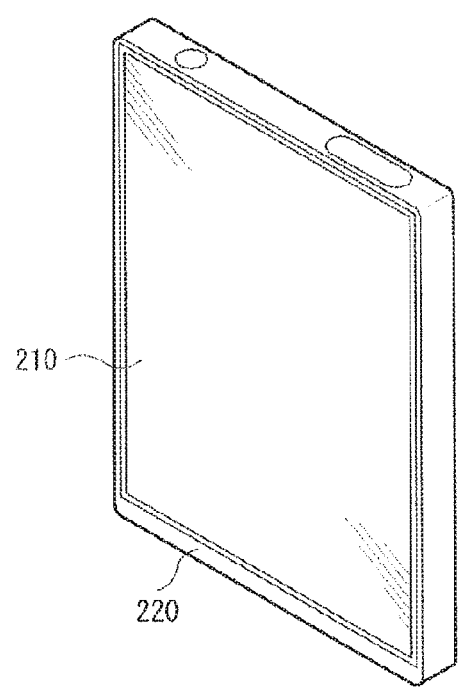

[ FIG. 13 ]
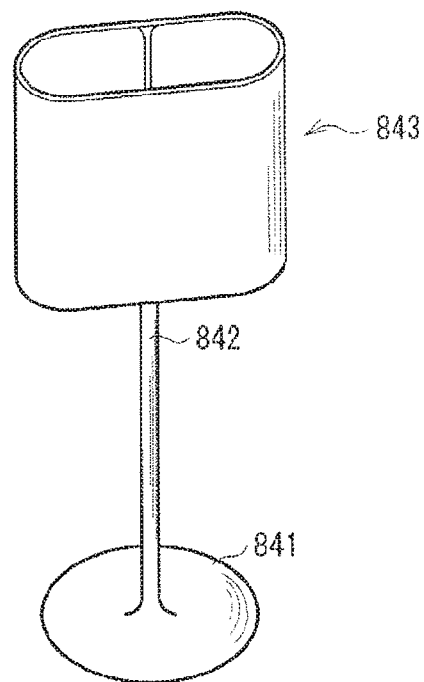
[ FIG. 14 ]
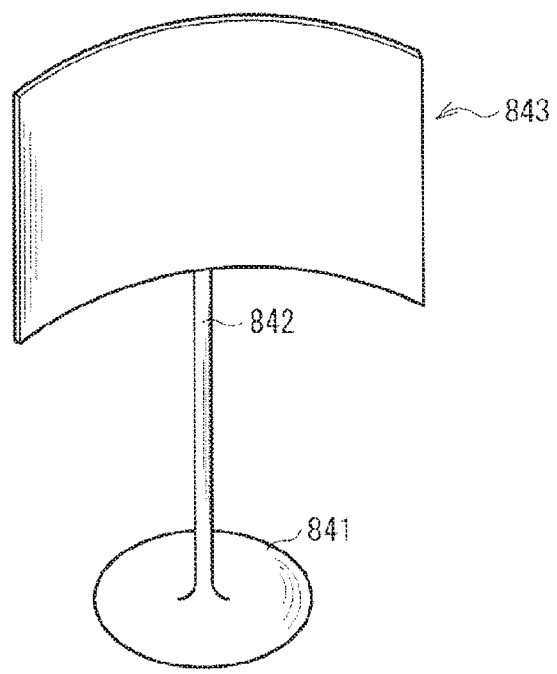

[FIG. 15]
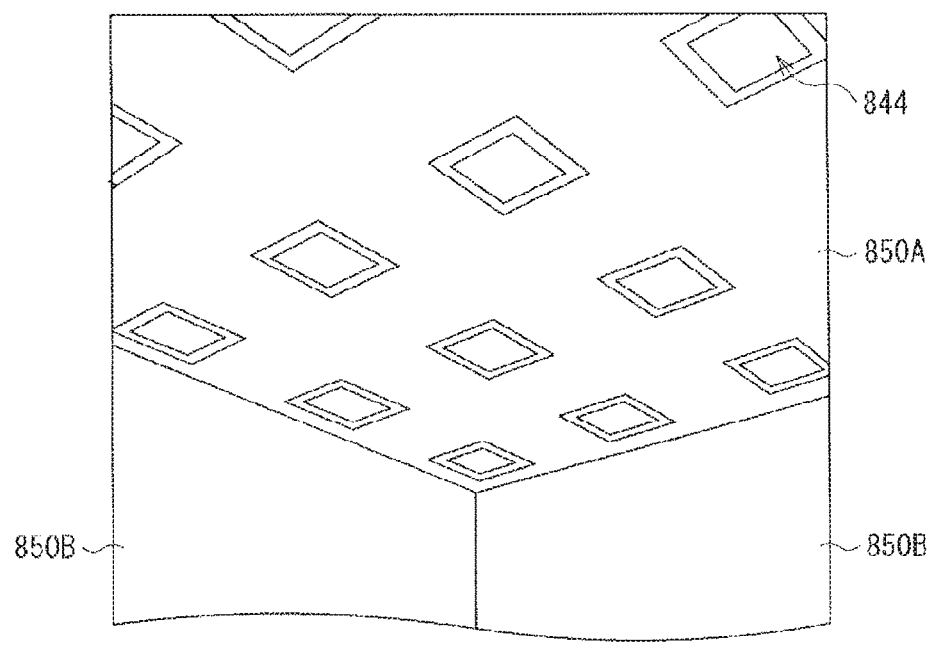

[FIG. 16A]
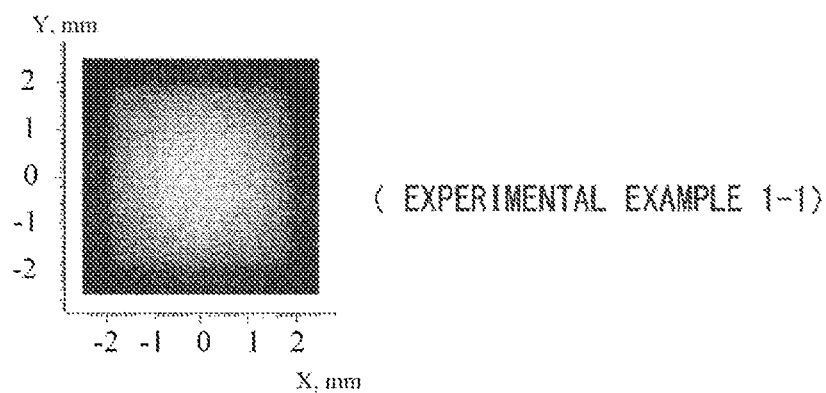
(EXPERIMENTAL EXAMPLE 1-1)
[FIG. 16B]
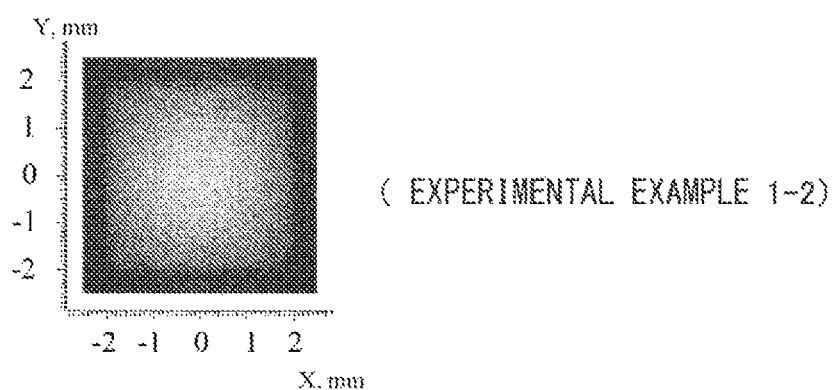
(EXPERIMENTAL EXAMPLE 1-2)
[FIG. 16C]
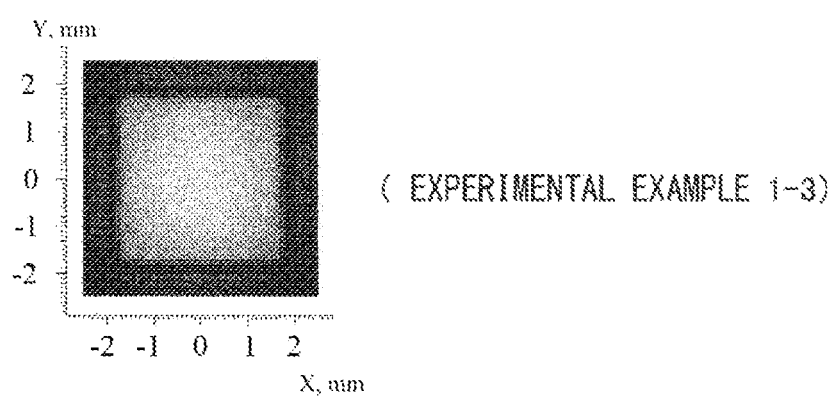
(EXPERIMENTAL EXAMPLE 1-3)

[FIG. 17]
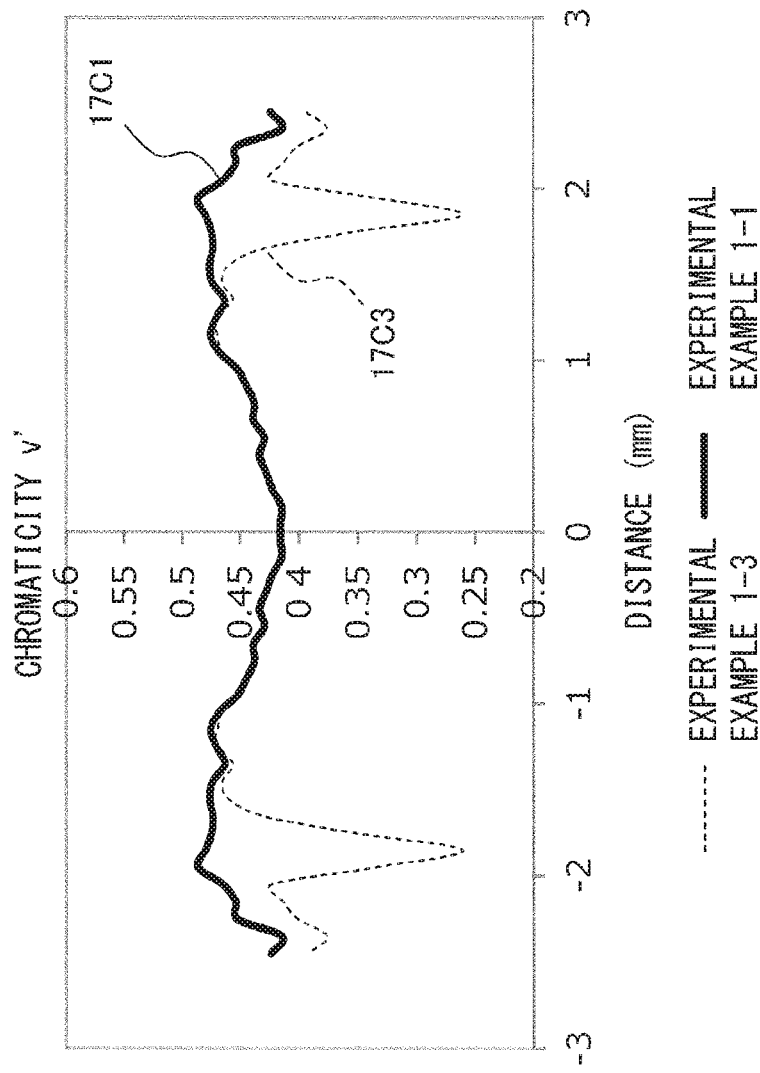

[FIG. 18A]
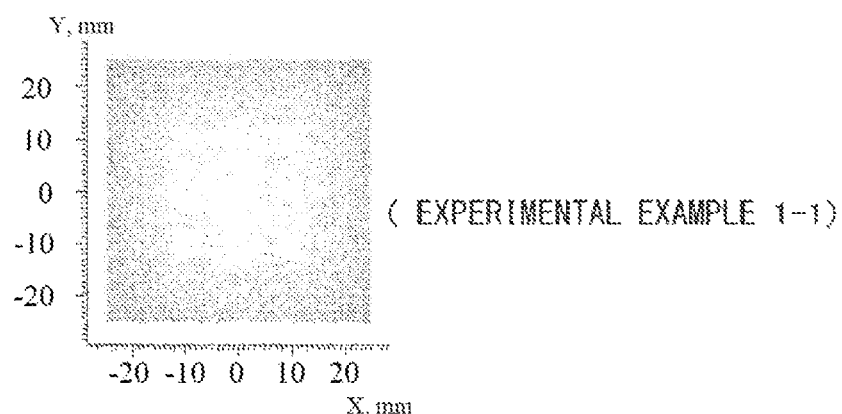
(EXPERIMENTAL EXAMPLE 1-1)
[FIG. 18B]
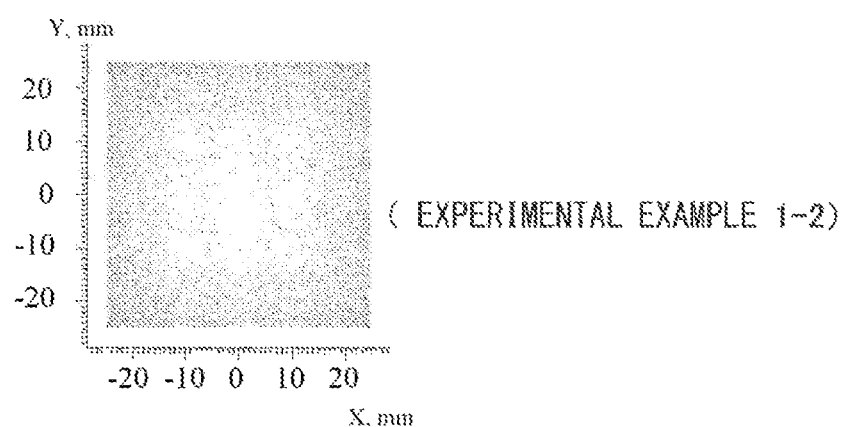
(EXPERIMENTAL EXAMPLE 1-2)
[FIG. 18C]
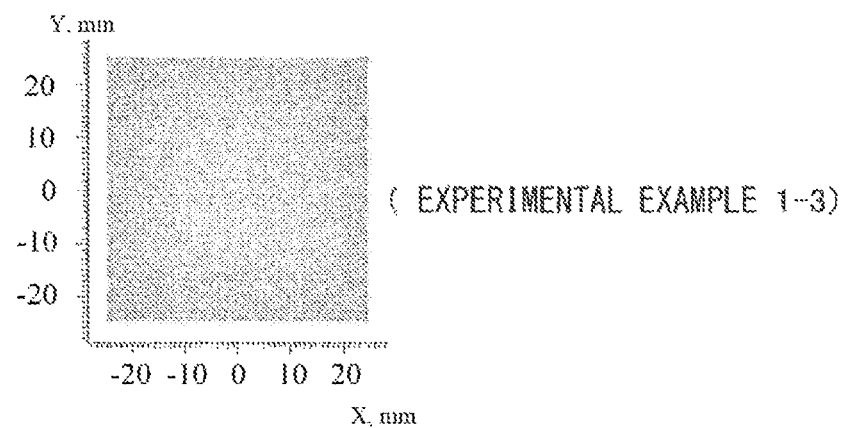
(EXPERIMENTAL EXAMPLE 1-3)

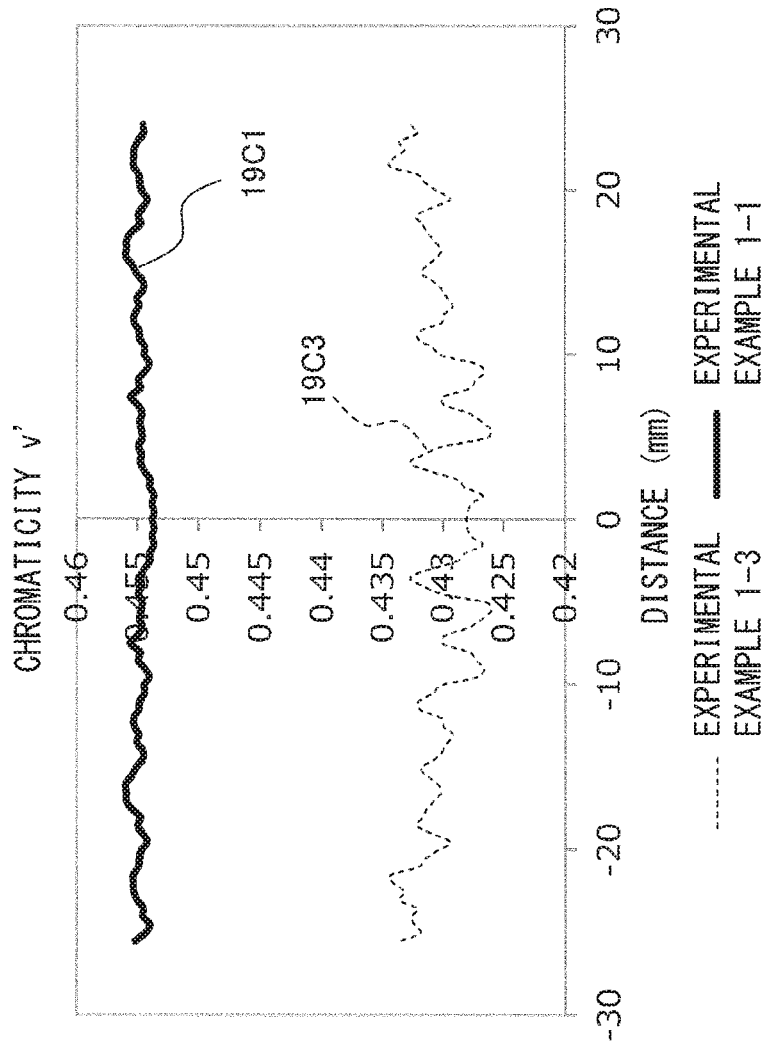
[FIG. 19]

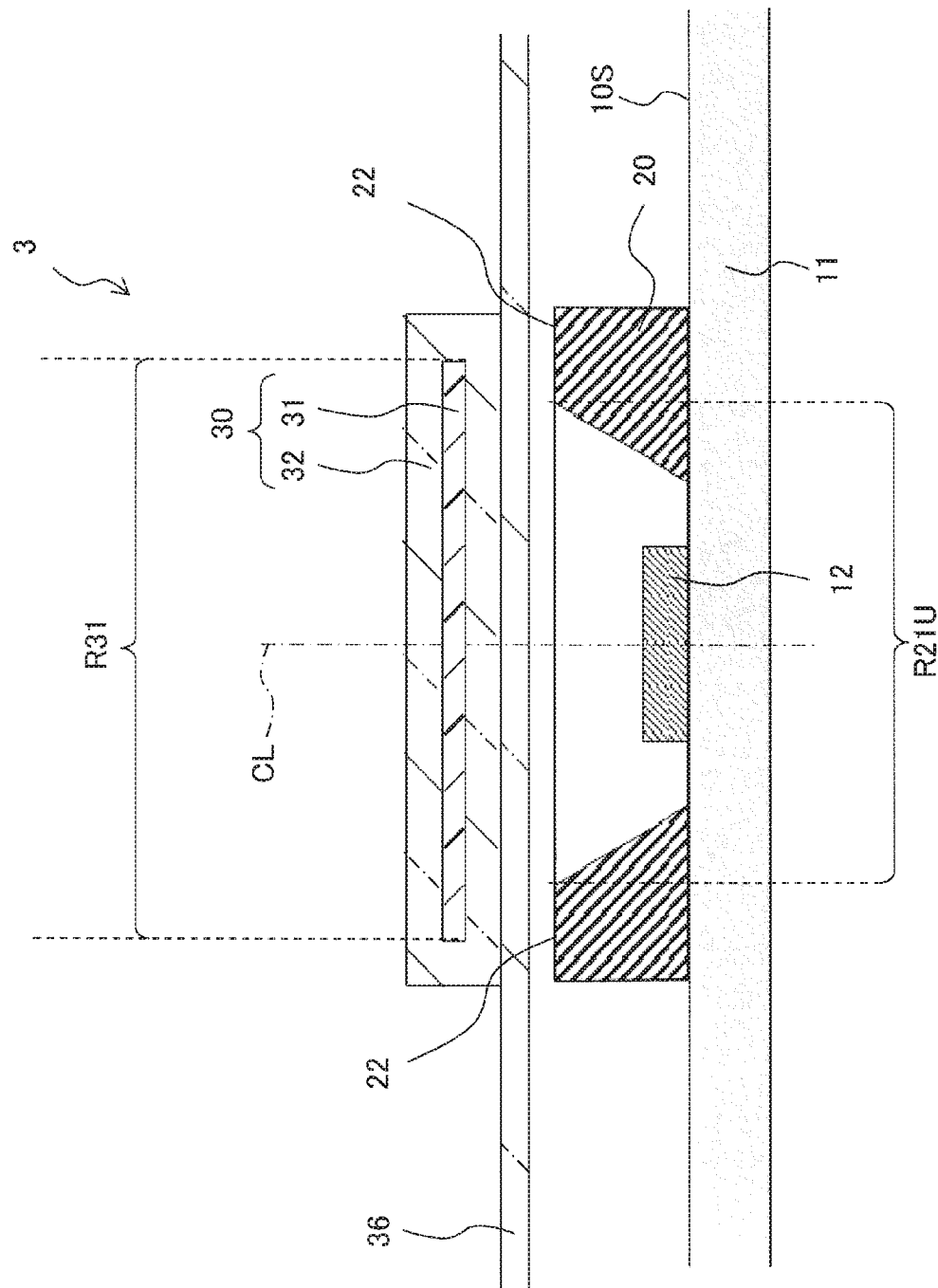

[FIG. 21]
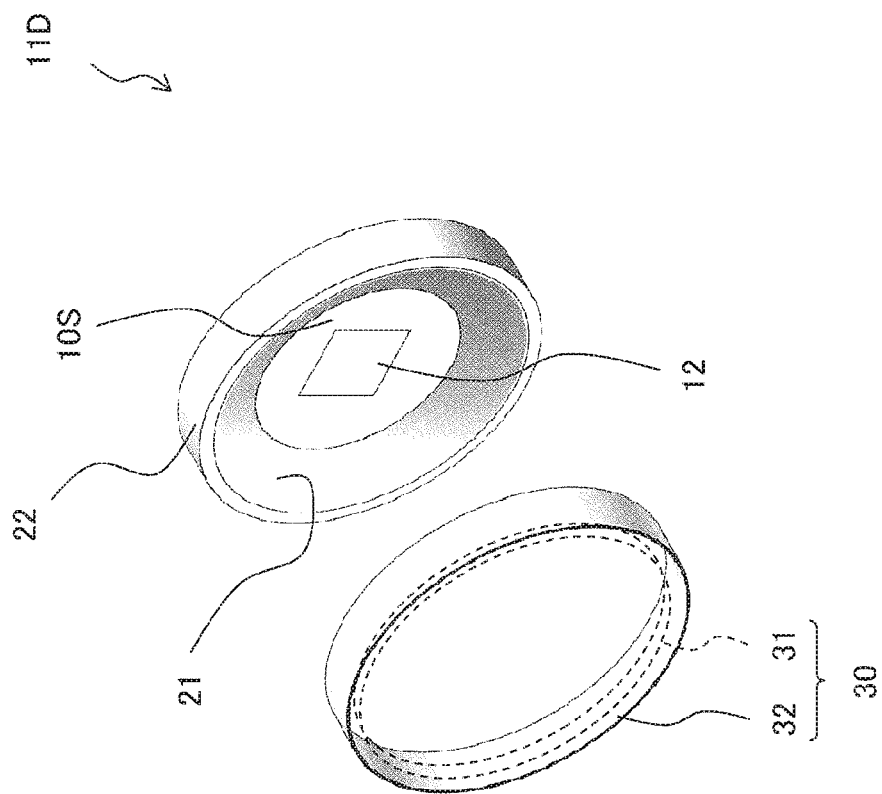

LIGHT-EMITTING DEVICE, DISPLAY APPARATUS, AND ILLUMINATION APPARATUS

CROSS REFERENCE TO RELATED APPLICATIONS

This application is a continuation of U.S. patent application Ser. No. 16/952,643, filed on Nov. 19, 2020, which is a continuation of U.S. patent application Ser. No. 16/084,642, filed on Sep. 13, 2018 (now U.S. Pat. No. 10,877,346, issued on Dec. 29, 2020), which application is a national phase entry under 35 U.S.C. 371 of International Application No. PCT/JP2017/002717 filed on Jan. 26, 2017, which claims priority from Japanese Patent Application No. JP 2016-060359 filed on Mar. 24, 2016, all of which are incorporated herein by reference.

TECHNICAL FIELD

The present disclosure relates to a light-emitting device, and a display apparatus and an illumination apparatus that include the light-emitting device.

BACKGROUND ART

A light-emitting device using blue LEDs (Light Emitting Diode) is employed for a backlight of a liquid crystal display apparatus or an illumination apparatus. For example, PTL 1 describes a so-called direct backlight that generates white color light through the combination of a plurality of the blue LEDs disposed on a substrate and a wavelength conversion sheet that covers them as a whole. Further, PTL 2 discloses a surface light source that generates white color light. The surface light source includes, in order, a blue LED, a reflection plate, a diffusion sheet, and a phosphor layer that performs wavelength conversion, in a stacked manner. In addition, PTL 3 also discloses a light-emitting device that performs wavelength conversion on light from a light-emitting element.

CITATION LIST

Patent Literature

PTL 1: Japanese Unexamined Patent Application Publication No. 2012-155999
PTL 2: International Publication No. WO 2010/150516
PTL 3: Japanese Unexamined Patent Application Publication No. 2009-140822

SUMMARY OF THE INVENTION

Incidentally, it is generally desired strongly for such a light-emitting device to efficiently emit light having reduced luminance unevenness, reduced color unevenness, etc. in a plane.

Therefore, it is desirable to provide a light-emitting device, and a display apparatus and an illumination apparatus that include the light-emitting device, that make it possible to emit, with high efficiency, light having higher uniformity in a plane.

A light-emitting device according to an embodiment of the present disclosure includes a light source, a wavelength conversion unit, and a wall member. The light source is disposed on a substrate. The wavelength conversion unit is disposed to face the light source in a thickness direction, and includes a wavelength conversion member and a transparent member. The wavelength conversion member converts first wavelength light from the light source to second wavelength light. The transparent member contains therein the wavelength conversion member. The wall member is provided on a substrate and surrounds the light source in a plane that is orthogonal to the thickness direction. Here, a region occupied by the wavelength conversion member is wider than a region surrounded by the wall member, and entirely overlaps with the region surrounded by the wall member in the thickness direction.

It is to be noted that "a wall member provided to surround each of the light sources" is a concept that encompasses not only a shape in which the wall member is integrally formed without any gap to surround the light source, but also a shape in which a slit is provided to a part of the wall member. The concept further encompasses a shape in which the wall member includes a plurality of parts, and the plurality of parts surround a single light source as a whole while each providing a slight gap therebetween.

Further, a display apparatus and an illumination apparatus according to the respective embodiments of the present disclosure include the above-described light-emitting device.

In the light-emitting device according to the embodiment of the present disclosure, the wavelength conversion member that is disposed to face the light source and performs wavelength conversion is contained in the transparent member. Therefore, it is possible to prevent the wavelength conversion member from being exposed to the external atmosphere including oxygen and moisture, and thereby the degradation of the wavelength conversion member is suppressed. Further, the region occupied by the wavelength conversion member is wider than the region surrounded by the wall member. In addition, the region occupied by the wavelength conversion member entirely overlaps with the region surrounded by the wall member in the thickness direction. Therefore, the first wavelength light from the light source is mostly converted to the second wavelength light. This leads to the improvement of conversion efficiency.

Another light-emitting device according to an embodiment of the present disclosure includes a light source, a wall member, and a wavelength conversion unit. The light source is disposed on a substrate. The wall member is provided on the substrate and surrounds the light source in a plane that is orthogonal to a thickness direction. The wavelength conversion unit includes a wavelength conversion member and a transparent member. The wavelength conversion member is disposed to face the light source in the thickness direction and converts first wavelength light from the light source to second wavelength light. The transparent member is placed to be directly or indirectly in contact with the wavelength conversion member and the wall member. Here, a region occupied by the wavelength conversion member is wider than a region surrounded by the wall member, and entirely overlaps with the region surrounded by the wall member in the thickness direction.

It is to be noted that "the transparent member is placed to be directly or indirectly in contact with the wavelength conversion member and the wall member" means that another member such as an adhesive may be provided between the wavelength conversion member and the transparent member, and between a plurality of wall members and the transparent member.

In another light-emitting device according to the embodiment of the present disclosure, the region occupied by the wavelength conversion member is wider than the region surrounded by the wall member, and entirely overlaps with the region surrounded by the wall member in the thickness direction. Thus, the first wavelength light from the light source is mostly converted to the second wavelength light. Therefore, the conversion efficiency is improved. Further, the transparent member is placed to be directly or indirectly in contact with the wavelength conversion member and the plurality of the wall members. Therefore, high thermal dissipation is ensured, and the deterioration of the wavelength conversion member is suppressed. Moreover, the distance between the light source and the wavelength conversion member is made shorter, thereby improving the luminance efficiency.

According to the light-emitting devices of the embodiments of the present disclosure, it is possible to suppress the deterioration of the wavelength conversion member and improve the conversion efficiency. Accordingly, it is possible to efficiently emit the light having reduced luminance unevenness or reduced color unevenness in a plane. Therefore, according to the display apparatus using this light-emitting device, it is possible to achieve display performance having superior color reproductivity, etc. Further, according to the illumination apparatus using this light-emitting device, it is possible to perform illumination to an object with more uniformity. It is to be noted that effects of the present disclosure are not limited to those described above, and may be any of effects that are described in the following.

BRIEF DESCRIPTION OF DRAWINGS

FIG. 1 is a perspective view of an entire configuration example of a light-emitting device according to a first embodiment of the present disclosure.

FIG. 2 is an enlarged perspective view of a configuration of a light-emitting section illustrated in FIG. 1.

FIG. 3 is a cross-sectional view of a main part configuration of the light-emitting device illustrated in FIG. 1.

FIG. 4 is an enlarged cross-sectional view of a configuration of a light-emitting section illustrated in FIG. 3.

FIG. 5 is a cross-sectional view of a configuration of a first modification example of the light-emitting section illustrated in FIG. 1.

FIG. 6 is a cross-sectional view of a configuration of a second modification example of the light-emitting section illustrated in FIG. 1.

FIG. 7 is a cross-sectional view of a configuration of a third modification example of the light-emitting section illustrated in FIG. 1.

FIG. 8 is a cross-sectional view of a main part configuration example of a light-emitting device according to a second embodiment of the present disclosure.

FIG. 9 is a perspective view of an appearance of a display apparatus according to a third embodiment of the present disclosure.

FIG. 10 is an exploded perspective view of a main body section illustrated in FIG. 9.

FIG. 11 is an exploded perspective view of a panel module illustrated in FIG. 10.

FIG. 12A is a perspective view of an appearance of a tablet terminal apparatus including a display apparatus of the present disclosure.

FIG. 12B is a perspective view of an appearance of another tablet terminal apparatus including the display apparatus of the present disclosure.

FIG. 13 is a perspective view of an appearance of a first illumination apparatus including a light-emitting device of the present disclosure.

FIG. 14 is a perspective view of an appearance of a second illumination apparatus including the light-emitting device of the present disclosure.

FIG. 15 is a perspective view of an appearance of a third illumination apparatus including the light-emitting device of the present disclosure.

FIG. 16A is a characteristic diagram illustrating a chromaticity distribution at a location directly above a wavelength conversion unit in Experimental Example 1-1.

FIG. 16B is a characteristic diagram illustrating a chromaticity distribution at a location directly above the wavelength conversion unit in Experimental Example 1-2.

FIG. 16C is a characteristic diagram illustrating a chromaticity distribution at a location directly above the wavelength conversion unit in Experimental Example 1-3.

FIG. 17 is a characteristic diagram illustrating, as a curved line, a variation of a chromaticity at a location directly above the wavelength conversion unit in Experimental Examples 1-1 and 1-3.

FIG. 18A is a characteristic diagram illustrating a chromaticity distribution of light that has passed through an optical sheet, in Experimental Example 1-1.

FIG. 18B is a characteristic diagram illustrating a chromaticity distribution of light that has passed through the optical sheet, in Experimental Example 1-2.

FIG. 18C is a characteristic diagram illustrating a chromaticity distribution of light that has passed through the optical sheet, in Experimental Example 1-3.

FIG. 19 is a characteristic diagram illustrating, as a curved line, a variation of a chromaticity of light that has passed through the optical sheet, in Experimental Examples 1-1 and 1-3.

FIG. 20 is a cross-sectional view of a configuration example of a light-emitting device as a fourth modification example of the present disclosure.

FIG. 21 is a perspective view of a configuration example of a light-emitting section as a fifth modification example of the present disclosure.

MODES FOR CARRYING OUT THE INVENTION

In the following, some embodiments of the present disclosure are described in detail with reference to the drawings. It is to be noted that description is given in the following order.

1. First Embodiment and Modification Examples Thereof

An example of a light-emitting device including a wavelength conversion unit in which a wavelength conversion member is sealed inside a transparent member 2. Second Embodiment An example of a light-emitting device in which a wavelength conversion member is placed on a holder with a transparent member provided therebetween 3. Third Embodiment (Display Apparatus; Liquid Crystal Display Apparatus)

4. Application Examples of Display Apparatus

5. Application Examples of Illumination Apparatus

6. Experimental Examples

7. Other Modification Examples

1. First Embodiment

[Configuration of Light-Emitting Device 1]

FIG. 1 is a perspective view of an entire configuration example of a light-emitting device 1 as a first embodiment of the present disclosure. FIG. 2 is an enlarged perspective view of a light-emitting section 11 as a main part of the light-emitting device 1. FIG. 3 illustrates a cross section taken along the line illustrated in FIG. 1. FIG. 4 is a further enlarged cross-sectional view of a single light-emitting section 11. The light-emitting device 1 is used, for example, as a backlight that illuminates a transmissive liquid crystal panel from behind, or as an illumination apparatus in a room, etc. As illustrated in FIG. 1, the light-emitting device 1 includes a plurality of light-emitting sections 11 and an optical sheet 50. The plurality of light-emitting sections 11 are disposed, for example, in a matrix on a substrate 10. The optical sheet 50 is so disposed, in common to the plurality of light-emitting sections 11, as to face the plurality of light-emitting sections 11. It is to be noted that FIG. 1 illustrates an example in which the plurality of light-emitting sections 11 are disposed along both an X-axis direction and a Y-axis direction that are orthogonal to each other; however, the present disclosure is not limited thereto.

In the specification, a distance direction of the substrate 10 and the optical sheet 50 is defined as a Z-axis direction (a front-back direction or a thickness direction). A vertical direction in a main surface (the widest surface) of the substrate 10 and the optical sheet 50 is defined as an X direction, and a horizontal direction in the main surface thereof is defined as a Y direction.

(Configuration of Light-Emitting Section 11)

With reference to FIGS. 2 to 4, description is given of a configuration of the light-emitting section 11. The plurality of light-emitting sections 11 each include a light-emitting element 12, a holder 20, and a wavelength conversion unit 30. Here, the light-emitting element 12 is a specific example that corresponds to a "light source" of the present disclosure. The holder 20 is a specific example that corresponds to a "wall member" of the present disclosure. The wavelength conversion unit 30 is a specific example that corresponds to a "wavelength conversion unit" of the present disclosure.

The light-emitting elements 12 are disposed in a matrix on a front surface 10S of the substrate 10. The light-emitting element 12 is a point light source. Specifically, the light-emitting element 12 includes an LED (Light Emitting Diode; light-emitting diode). The light-emitting element 12 includes, for example, an optical axis CL that coincides with the Z-axis direction. For example, the light-emitting element 12 faces a back surface 30S2 (refer to FIG. 4) of the wavelength conversion unit 30. The light-emitting element 12 may include a package structure having a light-emitting layer that is contained in a resin layer, or may alternatively be a flip chip LED (light-emitting diode) having a light-emitting layer provided in an exposed manner.

The holder 20 is so provided as to surround a single light-emitting element 12 in an XY plane that is orthogonal to the Z-axis direction, on the front surface 10S of the substrate 10. The holder 20 forms an air layer between the light-emitting element 12 and the wavelength conversion unit 30. In other words, the light-emitting element 12 is provided on the surface 10S of the substrate 10 in an opening part located at the middle of the holder 20. The center location in the XY plane of the holder 20 may coincide with the optical axis CL, for example. It is to be noted that the holder 20 may have a shape in which the holder 20 is integrally formed without any gap to surround the light-emitting element 12. The holder 20 may alternatively have a shape in which a slit is so provided to a part of the holder 20 as to have a discontinued part. Further, the holder 20 may include a plurality of parts which are separated from each other. The plurality of parts may surround a single light-emitting element 12 as a whole while each providing a slight gap therebetween. Furthermore, in the present embodiment, a single light-emitting element 12 is provided on a single light-emitting section 11 basis, and the holder 20 surrounds the single light-emitting element 12; however, the present disclosure is not limited thereto. For example, a plurality of light-emitting elements 12 may be provided to the single light-emitting section 11, and the holder 20 may surround the plurality of light-emitting elements 12.

The holder 20 includes an inner wall surface 21 and a top surface 22. The inner wall surface 21 faces the light-emitting element 12. The top surface 22 is located on side opposite to the substrate 10. The inner wall surface 21 is a reflection surface that reflects first wavelength light from the light-emitting element 12. The inner wall surface 21 is so inclined as to be away from the light-emitting element 12, as the inner wall surface 21 goes toward the wavelength conversion unit 30 from the substrate 10. Therefore, the area of a region R21U surrounded by an upper end edge 21TU of the inner wall surface 21 in the XY plane is larger than the area of a region R21B surrounded by a lower end edge 21TB of the inner wall surface 21 in the XY plane. In other words, the area of the region R21 in the XY plane, in a space surrounded by the inner wall surface 21 of the holder 20, becomes gradually larger as the area of the region R21 goes from the substrate 10 toward the wavelength conversion unit 30.

The holder 20 is formed, for example, by cutting-out from a plate-shaped member, injection molding, hot press molding, or the like. A constituent material of the holder 20 desirably includes a high thermally-conductive material having higher thermal conductivity than the thermal conductivity of the wavelength conversion unit 30, for example. Specifically, examples thereof include a metallic material including at least one of aluminum (Al) or copper (Cu). Alternatively, as a constituent material of the holder 20, a thermoplastic resin is also applicable, in addition to the metallic material. Examples of the thermoplastic resin include a polycarbonate resin, an acrylic resin such as PMMA (a polymethyl methacrylate resin), a polyester resin such as PET (polyethylene terephthalate), an amorphous copolymer polyester resin such as MS (a copolymer of methyl methacrylate and styrene), a polystyrene resin, and a polyvinyl chloride resin. Further, as in a light-emitting section 11A as a first modification example illustrated in FIG. 5, a thin film 21F including a high reflectance material may be formed on the inner wall surface 21 of the holder 20. Examples of the high reflectance material include an evaporated silver film, an evaporated aluminum film, or a multi-layer film-reflection film. This makes it possible to improve the reflectance of the inner wall surface 21, and further improve the light emission efficiency of the light-emitting device 1. It is to be noted that the high reflectance material refers to a material having higher reflectance than the reflectance of a transparent material 32 of the wavelength conversion unit 30, for example.

In this light-emitting device 1, the holder 20 including the inclined inner wall surface 21 is provided. This causes the first wavelength light emitted from the light-emitting element 12 to be reflected against the inner wall surface 21, following which the first wavelength light travels toward the wavelength conversion unit 30. Therefore, the inner wall surface 21 of the holder 20 allows the first wavelength light that is emitted diagonally from the light-emitting element 12 (a direction inclined with respect to the Z-axis direction) to be raised in a front direction (+Z direction), which leads to the contribution to the improvement of front luminance.

It is to be noted that, in the light-emitting device 1, the dimension W21 of the region R21U in the X-axis direction and the Y-axis direction is 3.5 mm, for example. The angle between the inner wall surface 21 and the front surface 10S of the substrate 10 is 45°, for example. Further, the height H20 (the dimension in the Z-axis direction) of the holder 20 is 0.55 mm, for example. Further, the dimension W12 of the light-emitting element 12 in the X-axis direction and the Y-axis direction is 1 mm, for example. The height H12 of a light-emitting point of the light-emitting element 12 is 0.3 mm, for example.

The top surface 22 of the holder 20 is directly or indirectly in contact with the back surface 30S2 (described later) of the wavelength conversion unit 30. This allows the holder 20 to so function as to hold the wavelength conversion unit 30. It is to be noted that the direct contacting of the top surface 22 of the holder 20 with the back surface 30S2 of the wavelength conversion unit 30 refers to, for example, a state in which the top surface 22 is directly joined with the back surface 30S2, through fusing, welding, or the like, without any other member interposed therebetween. Further, the direct contacting of the top surface 22 of the holder 20 with the back surface 30S2 of the wavelength conversion unit 30 refers to, for example, a state in which the top surface 22 is indirectly joined with the back surface 30S2 with another member such as an adhesive, a pressure sensitive adhesive, or the like, interposed therebetween.

The wavelength conversion unit 30 is disposed between the light-emitting element 12 and the optical sheet 50 in the Z-axis direction. The wavelength conversion unit 30 includes a wavelength conversion member 31 and the transparent member 32 containing the wavelength conversion member 31. The wavelength conversion unit 30 is so disposed as to face, in the Z-axis direction, the light-emitting element 12 surrounded by the holder 20. In other words, the wavelength conversion unit 30 is so disposed as to cover a location directly above the light-emitting device 12. The wavelength conversion unit 30 converts the wavelength of the light (the first wavelength light) that enters the back surface 30S2 from the light-emitting element 12 in the wavelength conversion member 31, and outputs second wavelength light (converted light) from a front surface 30S1, to thereby improve coloring characteristics, for example.

The wavelength conversion member 31 includes a phosphor (fluorescent substance) such as fluorescent pigment, fluorescent dye, or the like, or a light-emitting substance having a wavelength converting action such as a quantum dot. The wavelength conversion member 31 is a member based on processing, into a sheet-shaped shape, of a resin including, for example, a fluorescent material or a light-emitting body.

The wavelength conversion member 31 is excited by the first wavelength light from the light-emitting element 12. The first wavelength light enters the back surface 31S through the back surface 30S2. The wavelength conversion member 31 performs wavelength conversion on the first wavelength light under the principle of fluorescence emission, etc., to thereby output the second wavelength light from the front surface 31S1. The second wavelength light has a wavelength (second wavelength) that is different from that of the first wavelength. Here, the first wavelength and the second wavelength are not particularly limited. However, for example, in a case of a display device application, the first wavelength light may be blue color light (for example, a wavelength ranging from about 440 nm to about 460 nm), and the second wavelength light may be red color light (for example, a wavelength ranging from about 620 nm to about 750 nm) or green color light (for example, a wavelength ranging from about 495 nm to about 570 nm). In other words, a light-emitting element 12 is a blue color light source. In such a case, the wavelength conversion member 31 performs wavelength conversion on the blue color light into the red color light or the green color light.

The wavelength conversion member 31 preferably includes a quantum dot. The quantum dot is a particle having a long diameter in a range from about 1 nm to about 100 nm, and has a discrete energy level. An energy state of the quantum dot depends on a size thereof, and therefore, a change in the size allows for free selection of an emission wavelength. Further, emitted light of the quantum dot has a narrow spectrum width. A color gamut is expanded by combining light having such a steep peak. Therefore, the use of the quantum dot as a wavelength conversion material allows the color gamut to be expanded with ease. Moreover, the quantum dot has high responsiveness, thus allowing for efficient use of the light from the light-emitting element 12. In addition, the quantum dot is high in stability as well. The quantum dot is, for example, a compound of Group 12 elements and Group 16 elements, a compound of Group 13 elements and Group 16 elements, or a compound of Group 14 elements and Group 16 elements. Examples of the quantum dot include CdSe, CdTe, ZnS, CdS, PdS, PbSe, and CdHgTe.

In the XY plane, a region R31 occupied by the wavelength conversion member 31 is wider than the region R21U surrounded by the upper end edge 21TU of the holder 20. Further, the region R31 entirely overlaps with the region R21U surrounded by the holder 20 in the Z-axis direction (refer to FIG. 4). In other words, the end edge of the wavelength conversion member 31 in the XY plane extends outside the upper end edge 21TU of the holder 20. Therefore, the first wavelength light from the light-emitting element 12 is prevented from directly entering the optical sheet 50 not through the wavelength conversion member 31. In other words, all of the pieces of the first wavelength light from the light-emitting element 12 enter the wavelength conversion member 31 through the transparent member 32 and are subjected to wavelength conversion, following which the converted light travels toward the optical sheet 50. As a result, luminance unevenness and color unevenness are sufficiently reduced.

In addition, in the light-emitting device 1, the dimension W31 of the region R31 occupied by the wavelength conversion member 31 in the X-axis direction and the Y-axis direction is 3 mm, for example. The dimension W32, in the X-axis direction and the Y-axis direction, of the region R32 occupied by the transparent member 32 is 3.8 mm, for example. In addition, the thickness H31 of the wavelength conversion member 31 is 0.2 mm, for example. The thickness H32 of the transparent member 32 is 0.5 mm, for example.

The transparent member 32 protects the wavelength conversion member 31 by sealing the wavelength conversion member 31 so that the wavelength conversion member 31 is not exposed to the air containing oxygen and moisture. The transparent member 32 includes, for example, a transparent material such as glass or resin. The wavelength conversion member 31 serves as an active part that performs wavelength conversion on the light from the light-emitting element 12, while the transparent member 32 serves as a non-active part that allows incident light to transmit therethrough without performing wavelength conversion on the incident light.

The wavelength conversion unit 30 is placed on the top surface 22 of the holder 20. In other words, as described above, the back surface 30S2 of the wavelength conversion unit 30 (the transparent member 32) is directly or indirectly in contact with the top surface 22 of the holder 20, which allows the wavelength conversion unit 30 to be held by the holder 20. In this light-emitting device 1, a plurality of wavelength conversion members 31 (wavelength conversion units 30) are so provided as to be divided for each light-emitting section 11. Therefore, for example, as compared with a single wavelength conversion sheet that expands over the entire surface along the front surface 10S of the substrate 10, the amount of materials to be used is saved, which is advantageous in terms of cost saving and weight reduction.

Further, in the light-emitting device 1, as in a light-emitting section 11B as a second modification example illustrated in FIG. 6, for example, a low reflection layer 33 may be so provided as to cover the back surface 30S2. The low reflection layer 33 has lower reflectance than the reflectance of the inner wall surface 21. The first wavelength light that reaches the back surface 30S2 directly from the light-emitting element 12 or that is reflected against the inner wall surface 21 and then reaches the back surface 30S2 is less likely to be reflected against the back surface 30S2. This leads to the reduction. The first wavelength light emitted from the light-emitting element 12 is mostly subjected to wavelength conversion by the wavelength conversion member 31.

Further, in the light-emitting device 1, as in a light-emitting section 11C as a third modification example illustrated in FIG. 7, for example, a wavelength selective reflection layer 34 may be so provided as to cover the back surface 30S2. This is because it is possible to remove light components of unnecessary wavelength regions and select desired light components of wavelength regions to thereby allow the selected light component to enter the wavelength conversion member 31.

The optical sheet 50 is disposed to face the front surface 30S1 of the wavelength conversion unit 30. The optical sheet 50 includes, for example, a diffusion plate, a diffusion sheet, a lens film, a polarization separating sheet, etc. Providing such an optical sheet 50 makes it possible to allow the light that is emitted diagonally from the light-emitting element 12 or the wavelength conversion unit 30 to be raised in the front direction, which leads to further improvement of front luminance. [Workings and Effects of Light-Emitting Device 1]

In the light-emitting device 1, the light-emitting element 12 of the light-emitting section 11 is a point light source. Therefore, the first wavelength light emitted from the light-emitting element 12 spreads in all 360-degree directions from the center of light emission of the light-emitting element 12. The first wavelength light emitted from the light-emitting element 12 directly enters the back surface 30S2 of the wavelength conversion unit 30 as it is, or reflected against the inner wall surface 21 of the holder 20 followed by entering the back surface 30S2. The first wavelength light that has entered the wavelength conversion unit 30 is converted to the second wavelength light by the wavelength conversion member 31, following which the converted light is outputted from the front surface 30S1.

Finally, the converted light passes through the optical sheet 50 and is observed as light emission.

In the light-emitting device 1 according to the present embodiment, the wavelength conversion member 31 that is disposed to face the light-emitting element 12 and performs wavelength conversion is contained in the transparent member 32. Therefore, it is possible to prevent the wavelength conversion member 31 from being exposed to the air including oxygen and moisture, and thereby the degradation of the wavelength conversion member 31 is suppressed. Further, the region R31 occupied by the wavelength conversion member 31 is wider than the region R21U surrounded by the holder 20. In addition, the region R31 entirely overlaps with the region R21U in the thickness direction. Therefore, the first wavelength light from the light-emitting element 12 is mostly converted to the second wavelength light without being leaked. Therefore, occurrence of color unevenness is suppressed, and the conversion efficiency at each light-emitting section 11 is improved. Accordingly, color unevenness and light emission efficiency for the entire light-emitting device 1 are also improved.

In the light-emitting device 1 according to the present embodiment, the wavelength conversion unit 30 is placed on the top surface 22 in such a manner to be directly or indirectly in contact with the holder 20. Therefore, heat of the wavelength conversion member 31 is absorbed by the holder 20 through the transparent member 32, and thus, is easily dissipated to the outside. Therefore, high heat dissipation is ensured, and the deterioration of the wavelength conversion member 31 due to overheating is suppressed. Moreover, as compared with a case where the wavelength conversion unit 30 is spaced apart from the holder 20, the distance between the light-emitting element 12 and the wavelength conversion member 31 becomes shorter. Therefore, the improvement of luminance efficiency is expected.

In the light-emitting device 1 according to the present embodiment, the holder 20 has the reflection function of reflecting the first wavelength light from the light-emitting element 12 toward the wavelength conversion unit 30. In addition, the holder 20 also has a holding function of holding the wavelength conversion unit 30. This allows for a more compact configuration, which is advantageous in terms of size reduction, higher integration, and lower cost reduction.

As described, according to the light-emitting device 1, it is possible to improve the conversion efficiency while suppressing the deterioration of the wavelength conversion member 31. Accordingly, it is possible to efficiently emit the light having reduced luminance unevenness or reduced color unevenness in a plane. Therefore, according to a display apparatus using the light-emitting device 1, it is possible to achieve display performance having superior color reproductivity, etc. Further, according to an illumination apparatus using this light-emitting device 1, it is possible to perform further uniform illumination to an object.

2. Second Embodiment

[Configuration of Light-Emitting Device 2]

FIG. 8 is an enlarged cross-sectional view of a main part of a light-emitting device 2 according to a second embodiment of the present disclosure. The light-emitting device 2 includes a wavelength conversion unit 30A in place of the wavelength conversion unit 30. In the wavelength conversion unit 30A, the wavelength conversion member 31 is not sealed by the transparent member 32 but is placed on a sheet-shaped or plate-shaped transparent member 35. The transparent member 35 includes a front surface 35S1 and a back surface 35S2. The wavelength conversion member 31 is placed on the front surface 35S1. The back surface 35S2 is in contact with the top surface 22 of the holder 20 directly or indirectly. The light-emitting device 2 has the similar configuration to that of the light-emitting device 1 according to the first embodiment, excluding these points.

[Workings and Effects of Light-Emitting Device 2]

In such a light-emitting device 2 as well, the region R31 occupied by the wavelength conversion member 31 is wider than the region R21U surrounded by the holder 20. Further, the region R31 entirely overlaps with the region R21U in the thickness direction. Therefore, the first wavelength light from the light-emitting element 12 is mostly converted to the second wavelength light without being leaked. Therefore, occurrence of color unevenness is suppressed, and the conversion efficiency at each light-emitting section 11 is improved. Accordingly, color unevenness and light emission efficiency for the entire light-emitting device 2 are also improved.

In the light-emitting device 2, the wavelength conversion unit 30A is placed on the top surface 22 in such a manner to be directly or indirectly in contact with the holder 20. Therefore, heat of the wavelength conversion member 31 is absorbed by the holder 20 through the transparent member 35, and thus, is easily dissipated to the outside. Therefore, high heat dissipation is ensured, and the deterioration of the wavelength conversion member 31 due to overheating is suppressed. Moreover, as compared with a case where the wavelength conversion unit 30 is spaced apart from the holder 20, the distance between the light-emitting element 12 and the wavelength conversion member 31 becomes shorter. Therefore, the improvement of luminance efficiency is expected.

In the light-emitting device 2 according to the present embodiment, the holder 20 has the reflection function of reflecting the first wavelength light from the light-emitting element 12 toward the wavelength conversion unit 30. In addition, the holder 20 also has a holding function of holding the wavelength conversion unit 30. This allows for a more compact configuration, which is advantageous in terms of size reduction, higher integration, and lower cost reduction.

Accordingly, it is expected that the light-emitting device 2 achieves similar effects to these of the light-emitting device 1.

3. Third Embodiment

FIG. 9 illustrates an appearance of a display apparatus 101 according to a third embodiment of the present technology. The display apparatus 101 includes the light-emitting device 1, and is used as, for example, a low-profile television apparatus. The display apparatus 101 has a configuration in which a flat plate-shaped main body section 102 for image display is supported by a stand 103. It is to be noted that the display apparatus 101 is used as a stationary type that is placed on a level surface such as a floor, a shelf, or a table with the stand 103 attached to the main body section 102; however, the display apparatus 101 may be used as a wall-mounted type with the stand 103 being detached from the main body section 102.

FIG. 10 illustrates the main body section 102 illustrated in FIG. 9 in an exploded manner. The main body section 102 includes, for example, a front exterior member (bezel) 111, a panel module 112, and a rear exterior member (rear cover) 113 in this order from front side (viewer side). The front exterior member 111 is a bezel-shaped member that covers a front circumferential section of the panel module 112, and a pair of speakers 114 are disposed on the lower side of the front exterior member 111. The panel module 112 is fixed to the front exterior member 111, and a power supply board 115 and a signal board 116 are mounted on the rear side of the panel module 112, and a mounting fixture 117 is fixed on the rear side of the panel module 112. The mounting fixture 117 is adapted for mounting of a wall-mounting bracket, mounting of a board etc., and mounting of the stand 103. The rear exterior member 113 covers a rear surface and side surfaces of the panel module 112.

FIG. 11 illustrates the panel module 112 illustrated in FIG. 10 in an exploded manner. The panel module 112 includes, for example, a front chassis (top chassis) 121, a liquid crystal panel 122, a bezel-shaped member (middle chassis) 123, the optical sheet 50, the light source unit 1, a rear chassis (back chassis) 124, and a timing controller board 127 in this order from the front side (viewer side). The light source unit 1 includes a plurality of the light-emitting sections 11 arranged on the substrate 10.

The front chassis 121 is a bezel-shaped metallic component that covers a front circumferential section of the liquid crystal panel 122. The liquid crystal panel 122 has, for example, a liquid crystal cell 122A, a source substrate 122B, and a flexible substrate 122C such as a COF (Chip On Film). The flexible substrate 122C couples the liquid crystal cell 122A the source substrate 122B together. The bezel-shaped member 123 is a bezel-shaped resin component that holds the liquid crystal panel 122 and the optical sheet 50. The rear chassis 124 is a metallic component of a metal such as iron (Fe), and contains the liquid crystal panel 122, the bezel-shaped member 123, and the light-emitting device 1. The timing controller board 127 is also mounted on the rear side of the rear chassis 124.

In the display apparatus 101, light from the light-emitting device 1 is caused to selectively transmit by the liquid crystal panel 122 to perform image display. Here, the display apparatus 101 includes the light-emitting device 1 having superior light emission efficiency and improved in-plane color evenness as described in the first embodiment, resulting in enhancement of display quality of the display apparatus 101.

It is to be noted that a case in which the display apparatus 101 includes the light-emitting device 1 according to the first embodiment has been described in the above-described embodiment. However, the display apparatus 101 may include the light-emitting device 2 according to the second embodiment, in place of the light-emitting device 1.

4. Application Examples of Display Apparatus

Hereinafter, description is given of application examples of the display apparatus 101 as described above to electronic apparatuses. Examples of the electronic apparatuses include a television apparatus, a digital camera, a notebook personal computer, a mobile terminal apparatus such as a mobile phone, and a video camera. In other words, the above-described display apparatus is applicable to electronic apparatuses in every field that display image signals inputted from the outside or image signals generated inside as images or video pictures.

FIG. 12A illustrates an appearance of a tablet terminal apparatus to which the display apparatus 101 according to the above-described embodiment is applied. FIG. 12B illustrates an appearance of another tablet terminal apparatus to which the display apparatus 101 according to the above-described embodiment is applied. Each of these tablet terminal apparatuses includes, for example, a display section 210 and a non-display section 220, and the display section 210 includes the display apparatus 101 according to the above-described embodiment.

5. Application Examples to Illumination Apparatuses

Each of FIGS. 13 and 14 illustrates an appearance of a desktop illumination apparatus to which, for example, the light-emitting device 1 according to the above-described embodiment is applied. For example, this illumination apparatus includes an illuminating section 843 that is attached to a supporting post 842 provided on a base mount 841, and the illuminating section 843 includes, for example, the light-emitting device 1. Forming, for example, the substrate 10, and the optical sheet 50 in curved shapes allows the illuminating section 843 to take any form, such as a cylindrical shape illustrated in FIG. 13 or a curved shape illustrated in FIG. 14.

FIG. 15 illustrates an appearance of an indoor illuminating apparatus to which, for example, the light-emitting device 1 of the above-described embodiment, etc., is applied. This illuminating apparatus has, for example, illuminating sections 844 that include, for example, the light-emitting device 1. The appropriate number of illuminating sections 844 are disposed at appropriate spacing intervals on a ceiling 850A of a building. It is to be noted that installation locations of the illuminating sections 844 are not limited to the ceiling 850A, but the illuminating sections 844 may be installed at any location such as a wall 850B or a floor (not illustrated) depending on the intended use.

In these illuminating apparatuses, illumination is performed using light from, for example, the light-emitting device 1. Here, the illuminating apparatuses each include, for example, the light-emitting device 1 having superior light emission efficiency and improved in-plane luminance distribution, resulting in enhancement of illumination quality.

6. Experimental Examples

Experimental Examples 1-1 to 1-3

Samples of the light-emitting device 1 including the light-emitting sections 11 described in the above-described first embodiment were fabricated to compare states of color unevenness. Specifically, a light-emitting element 12 in a single light-emitting section 11 in the light-emitting device 1 was lighted, and chromaticity distribution at a location directly above the wavelength conversion unit 30 was measured. The results are as illustrated in FIGS. 16A, 16B, 16C, and 17. FIGS. 16A, 16B, and 16C are characteristic diagrams illustrating chromaticity distribution in an XY plane. FIGS. 16A, 16B, and 16C respectively correspond to Experimental Examples 1-1 to 1-3. In FIGS. 16A, 16B and 16C, the horizontal axis represents positions in the X-axis direction, and the vertical axis represents positions in the Y-axis direction. FIG. 17 is a characteristic diagram illustrating, as a curved line, a variation of chromaticity in the X-axis direction. In FIG. 17, the horizontal axis represents the distance (mm) from the optical axis CL in the X-axis direction, and the vertical axis represents chromaticity.

Further, in each of the samples of the above-described light-emitting device 1, 25 pieces of the light-emitting sections 11 were arranged each with the interval of 11 mm (5 rows×5 columns), and all of the light-emitting sections 11 were lighted to measure the chromaticity distribution of the light that has transmitted the optical sheet 50. The results are illustrated in FIGS. 18A, 18B, 18C, and 19. FIGS. 18A, 18B, and 18C are characteristic diagrams illustrating chromaticity distribution in an XY plane. FIGS. 18A, 18B, and 18C respectively correspond to Experimental Examples 1-1 to 1-3. In FIGS. 18A, 18B and 18C, the horizontal axis represents positions in the X-axis direction, and the vertical axis represents positions in the Y-axis direction. FIG. 19 is a characteristic diagram illustrating, as a curved line, a variation of chromaticity in the X-axis direction. In FIG. 19, the horizontal axis represents the distance (mm) from the optical axis CL in the X-axis direction, and the vertical axis represents chromaticity.

Here, the dimension W31 of the wavelength conversion member 31 was set to 3.8 mm in Experimental Example 1-1, 4.0 mm in Experimental Example 1-2, and 3.5 mm in Experimental Example 1-3 (refer to FIG. 4). Conditions other than the dimension thereof were the same in Experimental Examples 1-1 to 1-3. Specifically, the wavelength conversion unit 30 was set to have the thickness H31 of 0.2 mm and the thickness H32 of 0.5 mm. A quantum dot was used for the wavelength conversion member 31. Glass was used for the transparent member 32. Further, the holder 20 was set to have the dimension W21 of 3.5 mm, the height H20 of 0.55 mm, and the angle of the inner wall surface 21 with respect to the front surface of 10S of 30°. Further, for the light-emitting element 12, a blue color LED package was used which had the dimension W12 of 1 mm and the height of a light-emitting point H12 of 0.3 mm. Further, the distance OD from the front surface 10S of the substrate 10 to the back surface of the optical sheet 50 (the surface facing the light-emitting section 11) was set to 10 mm.

As illustrated in FIGS. 16C and 17 (the curved line 17C3), in Experimental Example 1-3, a state in which blue color light was leaked from the vicinity of the end edge of the wavelength conversion member 31 was confirmed. This is presumably due to the dimension W31 of the region R31 being the same as the dimension W21 of the region R21U. In other words, a reason is that a portion of the blue color light from the light-emitting element 12 was transmitted through the transparent member 32 that covered the end edge of the wavelength conversion member 31, and was outputted from the front surface 3051 without being subjected to wavelength conversion.

To the contrary, as illustrated in FIGS. 16A and 17 (the curved line 17C1), in Experimental Examples 1-1 and 1-2, leakage of blue color light even from the vicinity of the end edge of the wavelength conversion member 31 was not visually confirmed. This is because the dimension W31 of the region R31 is larger than the dimension W21 of the region R21U, and the region R31 occupied by the wavelength conversion member 31 entirely overlaps with the region R21U.

Further, as is apparent from FIGS. 18A, 18B, 18C, and 19, the color unevenness in the XY plane, after having caused the light to transmit through the optical sheet 50 including the diffusion sheet, was reduced more in Experimental examples 1-1 and 1-2 than Experimental Example 1-3. It is to be noted that, in FIG. 19, the curved line 19C1 corresponds to Experimental Example 1-1, and the curved line 19C3 corresponds to Experimental Example 1-3.

As described, according to the present disclosure, it was confirmed that the color unevenness was sufficiently reduced.

7. Other Modification Examples

Although description has been given of the present disclosure by referring to the embodiments and the modification examples, the present disclosure is not limited thereto, and may be modified in a variety of ways. For example, the material and the thickness of each layer described in the above-described embodiments are not limited thereto, and another material and thickness may be employed.

Fourth Modification Example

Further, in the above-described embodiments, etc., the wavelength conversion unit 30 is directly or indirectly in contact with the holder 20; however, as in a light-emitting device 3 as illustrated in FIG. 20, for example, the wavelength conversion unit 30 may be placed on a transparent member 36, and the transparent member 36 may be spaced apart from the top surface 22 of the holder 20.

Fifth Modification Example

Further, in the above-described embodiments, etc., the planar shape of the wavelength conversion unit 30, the outer rim of the holder 20, the planar shape of the opening, etc. are formed in a square shape; however, the present technology is not limited thereto. For example, as in a light-emitting section 11D illustrated in FIG. 21, for example, the planar shape of the wavelength conversion unit 30, the outer rim of the holder 20, the planar shape of the opening, etc. may be formed in a circular shape. Alternatively, they may be formed in a polygonal shape such as hexagon, other than square. In such a case, the planar shapes of all of the light-emitting sections in the light-emitting device may be in an identical shape, or some of them may be in a different shape.

Additionally, for example, in the above-described embodiments and modification examples, the description has been given by specifically referring to configurations of the light-emitting devices 1 to 3 and the display apparatus 101 (the television apparatus); however, it is unnecessary to provide all of the components, and other components may be provided.

It is to be noted that the effects described herein are merely illustrative and non-limiting, and may further include other effects. Further, the present technology may have the following configurations.

(1)
A light-emitting device including:
a light source disposed on a substrate;
a wavelength conversion unit that is disposed to face the light source in a thickness direction and includes a wavelength conversion member and a transparent member, the wavelength conversion member converting first wavelength light from the light source to second wavelength light, the transparent member containing therein the wavelength conversion member; and
a wall member that is provided on the substrate and surrounds the light source in a plane that is orthogonal to the thickness direction,
a region occupied by the wavelength conversion member being wider than a region surrounded by the wall member, and entirely overlapping with the region surrounded by the wall member in the thickness direction.

(2)
The light-emitting device according to (1), in which the wall member is directly or indirectly in contact with the wavelength conversion unit, and holds the wavelength conversion unit.

(3)
The light-emitting device according to (1) or (2), further including a light diffusion member that covers a plurality of the light sources in common, in which the wavelength conversion unit is disposed between the plurality of light sources and the light diffusion member in the thickness direction.

(4)
The light-emitting device according to any one of (1) to (3), in which the wall member includes an inner wall surface that reflects the first wavelength light derived from the light source, and the inner wall surface is inclined to be away from the light source, as the inner wall surface goes toward the wavelength conversion unit from the substrate.

(5)
The light-emitting device according to any one of (1) to (4), in which the wall member includes a high thermally-conductive material having higher thermal conductivity than thermal conductivity of the wavelength conversion unit.

(6)
The light-emitting device according to (5), in which the high thermally-conductive material includes at least one of aluminum or copper.

(7)
The light-emitting device according to any one of (1) to (6), in which
the wall member includes an inner wall surface that reflects the first wavelength light derived from the light source, and
the inner wall surface is a surface of a high reflectance material that has a higher reflectance than a reflectance of the wavelength conversion unit.

(8)
The light-emitting device according to (7), in which the high reflectance material includes at least one of aluminum or silver.

(9)
The light-emitting device according to any one of (1) to (8), in which the light source is a flip chip LED (light-emitting diode).

(10)
The light-emitting device according to any one of (1) to (9), including an air layer provided between the light source and the wavelength conversion unit.

(11)
The light-emitting device according to any one of (1) to (10), in which the wavelength conversion material is a quantum dot.

(12)
The light-emitting device according to any one of (1) to (11), in which
the wall member includes an inner wall surface that reflects the first wavelength light derived from the light source, and
a low reflection layer is provided on a light-incidence surface of the wavelength conversion unit, the light-incidence surface facing the light source, the low reflection layer having a lower reflectance than a reflectance of the inner wall surface.

(13)
The light-emitting device according to any one of (1) to (12), in which a wavelength selective reflection layer is provided on a light-incidence surface of the wavelength conversion unit, the light-incidence surface facing the light source.

(14)

The light-emitting device according to any one of (1) to (13), in which all of pieces of the first wavelength light from the light source enter the wavelength conversion member via the transparent member.

(15)

A light-emitting device including:

a light source disposed on a substrate;

a wall member that is provided on the substrate and surrounds the light source in a plane that is orthogonal to a thickness direction; and a wavelength conversion unit including a wavelength conversion member and a transparent member, the wavelength conversion member being disposed to face the light source in the thickness direction and converting first wavelength light from the light source to second wavelength light, the transparent member being placed to be directly or indirectly in contact with the wavelength conversion member and the wall member, a region occupied by the wavelength conversion member being wider than a region surrounded by the wall member, and entirely overlapping with the region surrounded by the wall member in the thickness direction.

(16)

A display apparatus provided with a liquid crystal panel and a light-emitting device on rear side of the liquid crystal panel, the light-emitting device including:

a plurality of light sources disposed on a substrate;

a plurality of wavelength conversion units that are disposed to face the respective plurality of light sources in a thickness direction and each including a wavelength conversion member and a transparent member, the wavelength conversion member converting first wavelength light from the plurality of light sources to second wavelength light, the transparent member containing therein the wavelength conversion member; and a plurality of wall members that are provided on the substrate and surround the respective plurality of light sources in a plane that is orthogonal to the thickness direction, a region occupied by the wavelength conversion member being wider than a region surrounded by the plurality of wall members, and entirely overlapping with the region surrounded by the wall member in the thickness direction.

(17)

An illumination apparatus provided with a light-emitting device, the light-emitting device including:

a plurality of light sources disposed on a substrate;

a plurality of wavelength conversion units that are disposed to face the respective plurality of light sources in a thickness direction and each including a wavelength conversion member and a transparent member, the wavelength conversion member converting first wavelength light from the plurality of light sources to second wavelength light, the transparent member containing therein the wavelength conversion member; and a plurality of wall members that are provided on the substrate and surround the respective plurality of light sources in a plane that is orthogonal to the thickness direction, a region occupied by the wavelength conversion member being wider than a region surrounded by the plurality of wall members, and entirely overlapping with the region surrounded by the wall member in the thickness direction.

The present application is based on and claims priority from Japanese Patent Application No. 2016-60359 filed with the Japan Patent Office on Mar. 24, 2016, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A display device comprising, a first exterior member holding a light-emitting device; and a second exterior member covering a back surface of the light-emitting device; wherein the light-emitting device comprises:

a plurality of light sources disposed on a substrate;

a plurality of wavelength conversion units that are disposed to face the plurality of light sources in a thickness direction and including a wavelength conversion member, the wavelength conversion member included in one of the plurality of the wavelength conversion units converts first wavelength light from one of the plurality of light sources to second wavelength light, the wavelength conversion member comprises quantum dot being particles having a long diameter in a range from 1 nm to 100 nm;

a transparent member positioned on either a light-incidence surface or a light exit surface of the wavelength conversion member, the transparent member being thicker than a thickness of the wavelength conversion member in the thickness direction; and a plurality of wall members that are provided above the substrate and surround the plurality of light sources in a plane that is orthogonal to the thickness direction;

wherein the first wavelength light being blue color light and the second wavelength light being red color light or green color light.

2. The display device according to claim 1, wherein a top surface of each of the plurality of wall members is under a back surface of each of the plurality of wavelength conversion units.

3. The display device according to claim 1, wherein a top surface of each of the plurality of wall members is indirectly in contact with a back surface of each of the plurality of wavelength conversion units.

4. The display device according to claim 1 comprising a wavelength selective reflection layer comprising a continuous film provided on the light-incidence surface of the wavelength conversion units.

5. The display device according to claim 1, wherein regions occupied by the wavelength conversion member are wider than regions surrounded by the wall members and the regions occupied by the wavelength conversion member entirely overlaps the regions surrounded by the wall members in the thickness direction.

6. The display device according to claim 1, wherein the wall members support the wavelength conversion units.

7. The display device according to claim 1, further comprising a single light diffusion member that commonly covers a plurality of the light sources.

8. The display device according to claim 7, wherein the wavelength conversion units are disposed between the plurality of light sources and the light diffusion member in the thickness direction.

9. The display device according to claim 1, wherein the wall members include inner wall surfaces that reflects the first wavelength light derived from at least one of the plurality of light sources.

10. The display device according to claim 1, wherein the first exterior member comprises a metal.

11. The display device according to claim 1, wherein the wavelength conversion units comprise the transparent member and heat from the wavelength conversion member is absorbed by the wall members through the transparent member.

12. The display device according to claim 1, wherein the wavelength conversion units comprise the transparent member and the transparent member protects the wavelength conversion member from moisture.

13. The display device according to claim 1, wherein at least one of the wall members forms a rectangular shape.

14. The display device according to claim 1, wherein at least one of the wall members forms a circular shape.

15. The display device according to claim 1, wherein at least one of the wall members forms a polygon having more than four sides.

16. The display device according to claim 1, wherein an air layer is provided between the light sources and the wavelength conversion units.

17. The display device according to claim 1, wherein the wavelength conversion units comprise the transparent member, the wavelength conversion units are placed on top surfaces of the wall members, and heat of the wavelength conversion member is absorbed by the wall members through the transparent member.

18. The display device according to claim 1, comprising a liquid crystal panel over the light emitting device.

19. The display device according to claim 18, comprising a wavelength selective reflection layer comprising a continuous film provided on the light-incidence surface of the wavelength conversion units.

20. The display device according to claim 1, comprising a wavelength selective reflection layer, the wavelength selective reflection layer comprising a continuous film provided on the light-incidence surface of the wavelength conversion units.

* * * * *